US012774970B1

(12) United States Patent
Zens

(10) Patent No.: US 12,774,970 B1
(45) Date of Patent: Oct. 27, 2026

(54) DEVICE AND METHOD TO MODULATE SPLITTING OF THE RESONANCE TO DETECT TWO MODES IN NMR PROBE

(71) Applicant: JEOL LTD., Tokyo (JP)

(72) Inventor: Albert Zens, Peabody, MA (US)

(73) Assignee: JEOL LTD, Tokyo (JP)

( * ) Notice: Subject to any disclaimer, the term of this patent is extended or adjusted under 35 U.S.C. 154(b) by 0 days.

(21) Appl. No.: 19/420,162

(22) Filed: Dec. 15, 2025

(51) Int. Cl.
*G01N 24/08* (2006.01)
*G01R 33/34* (2006.01)

(52) U.S. Cl.
CPC ............. *G01N 24/08* (2013.01); *G01R 33/34* (2013.01)

(58) Field of Classification Search
CPC ................................ G01N 24/08; G01R 33/34
USPC .......................................................... 324/309
See application file for complete search history.

(56) References Cited

U.S. PATENT DOCUMENTS 5,243,289 A * 9/1993 Blum ................. G01R 33/3635 324/322
6,307,371 B1 * 10/2001 Zeiger ................ G01R 33/3635 324/318
6,933,725 B2 * 8/2005 Lim ................... G01R 33/3635 324/318
2002/0130661 A1 * 9/2002 Raftery ............ G01R 33/34053 324/309
2011/0074415 A1 * 3/2011 Chu ................... G01R 33/3415 324/309

* cited by examiner

*Primary Examiner* — Roberto Velez
(74) *Attorney, Agent, or Firm* — SCI-LAW STRATEGIES, PC

(57) ABSTRACT

In various embodiments of the invention, a third circuit is used to adjust the splitting of two or more modes generated by a sample coil in a first circuit inductively coupled to a loop gap coil in a second circuit, where the splitting of the sample coil and the loop gap coil is adjusted to measure two or more nuclei in a high resolution nuclear magnetic resonance probe utilizing radio frequency signals. In various embodiments of the invention, the third circuit can either be electrically connected to the second circuit or alternatively inductively coupled to the second circuit.

20 Claims, 14 Drawing Sheets

FIG. 3C
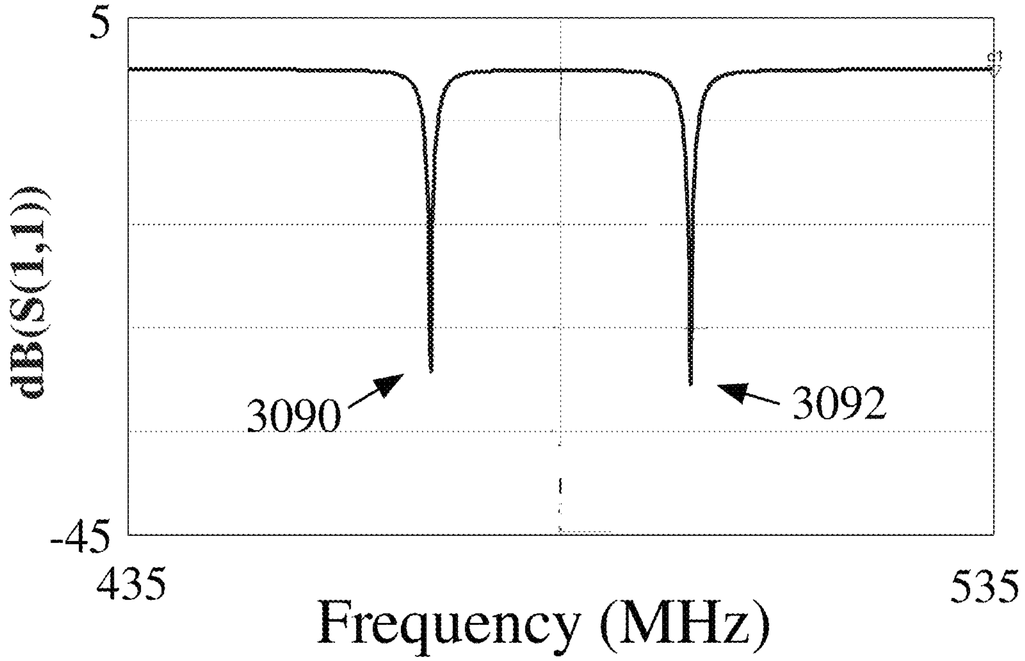
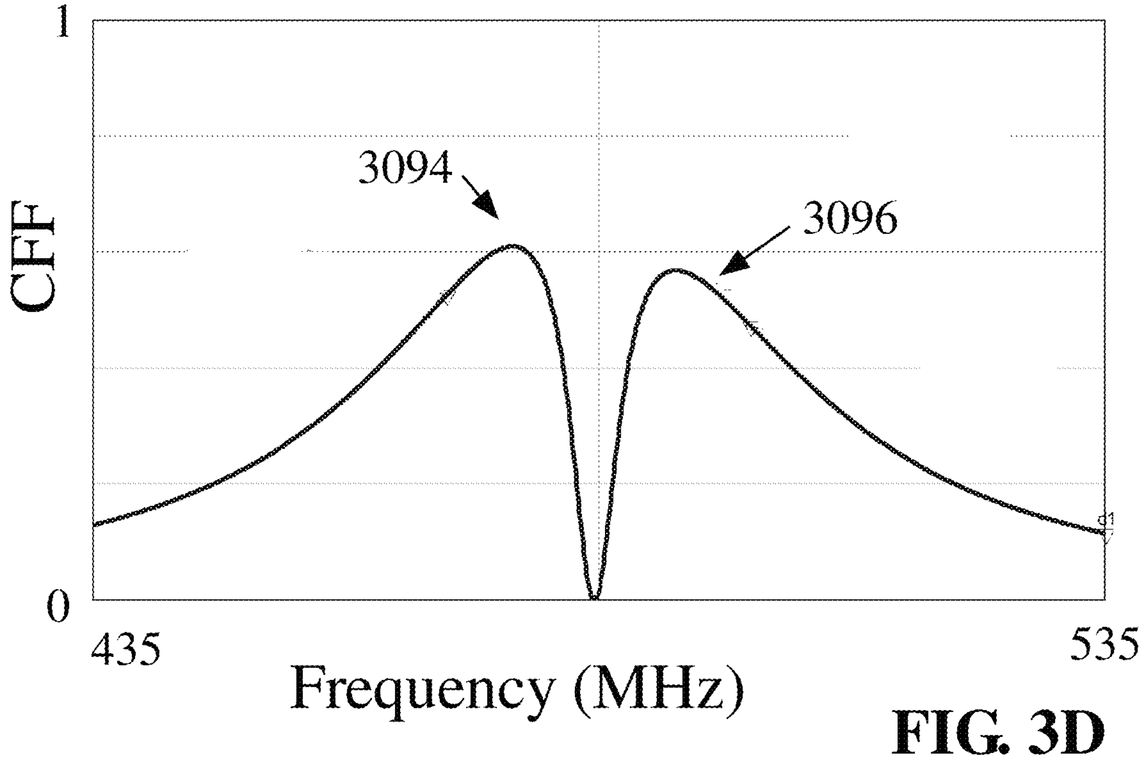
FIG. 3D $$M_{a,b} = K_1 * (L_a * L_b)^{1/2} \qquad \text{Equation 1}$$

$$SNR = K_2 * (SFF * CFF_{k,a} * Qk)^{1/2} \qquad \text{Equation 2}$$

$$CFF_{k,a} = (L_a * i_a^2) / \Sigma^N{}_{j=1}(L_j * i_j^2) \qquad \text{Equation 3}$$

FIG. 9

DEVICE AND METHOD TO MODULATE SPLITTING OF THE RESONANCE TO DETECT TWO MODES IN NMR PROBE

FIELD OF THE INVENTION

The present invention relates to methods and devices to adjust the splitting of two or more modes generated by a sample coil coupled to a loop gap coil, where the splitting of the sample coil and the loop gap coil is adjusted to measure two or more nuclei in a high resolution nuclear magnetic resonance probe utilizing radio frequency signals.

BACKGROUND OF THE INVENTION

Nuclear Magnetic Resonance (NMR) spectroscopy can provide extensive chemical information. NMR can provide structural information and also information on both intermolecular and intramolecular dynamics. Applications of NMR range from determination of three-dimensional structures of large proteins to the analysis of very small amounts of products from combinatorial syntheses. Furthermore, NMR is a nondestructive analytical method.

NMR generally uses induction to detect the oscillating magnetic moment from nuclei precessing in a magnetic field. Because the signal from these precessing nuclei is inherently weak research efforts have been focused on improving the signal to noise ratio (SNR) obtained in NMR experiments. There are two general ways to increase the SNR. One way is to increase the size of the magnetic field. Currently superconducting magnets with up to 1.2 GHz are commercially available. While these powerful magnets, are increasingly being employed, there is an upper limit to the critical field generated by a superconducting magnet. The SNR can also be increased by decreasing the noise. For example, by cooling the coils and electronics used to detect the signal the SNR can be increased.

High resolution NMR probes typically have an 'inner coil' for irradiation and detection of a first nuclear species, and a second larger coil, coaxial with the inner coil, for irradiation of one or more other nuclear species. The two coils are typically oriented 90° with respect to each other to minimize coupling between the two coils. Capacitive coupling has previously been used to form double-tuned high resolution NMR probes for $^{1}H$-$^{2}H$, $^{13}C$-$^{15}N$ and $^{1}H$-$^{19}F$.

Magnetic coupling loops, coupling resonators, variable tuning capacitors, pulse field gradients, Faraday shields and loop gap shields can all be detrimental to the performance of the probe in some manner. The RF homogeneity of the sample coil can be impacted by the presence of additional metallic objects and the presence of magnetic coupling loops or resonators that couple to the sample coil. All of the above, shields, coupling loops, variable capacitors, resonators, pulse field gradients etc., can dilute the SNR of the NMR experiment even if only in a minor manner. From the above it can be deduced that the fewer the number of objects in the sample region of the NMR probe the better the SNR.

In U.S. Pat. No. 6,933,725 to Lim et al., a circuit for a NMR probe uses three resonators to create resonances intermediate to the resonator resonant frequencies for two closely spaced high frequencies, such as those used for the excitation of $^{1}H$ and $^{19}F$. The resonators are arranged in a parallel combination with input ports connected to it for inputting the desired high frequency resonances. Soltesova et al., describe a magic angle spinning dynamic nuclear polarization probe with separate radiofrequency channels excitation of $^{1}H$ and detection of $^{13}C$ or $^{19}F$, "$^{1}H$-$^{19}F$ Cross polarization magic angle spinning dynamic nuclear polarization NMR investigation of advanced pharmaceutical formulations", Journal of Magn. Reson., 371 (2025) 107827, Elsevier.

In the last 20 years cooling the coils has been the major focus of NMR research. For example, to provide improved sensitivity the electronics for signal detection can be cryo-cooled. However, the SNR of the RF homogeneity of the sample coil can be degraded by magnetic coupling to the coil with even small k (coupling constant) values. Further, the leads connecting a variable capacitor to the sample coil have an inductance. The inductance of these leads does not produce a flux in the $B_1$ field that penetrates the sample and thus results in lowered sensitivity.

Soltesova et al. state "Currently, there are two types of HFX probes for room temperature measurements . . . : the ones with separate channels for $^{1}H$ and $^{19}F$, and the ones with a single channel with the use of external splitters.", Soltesova et al., $^{1}H$-$^{19}F$ cross-polarization magic angle spinning dynamic nuclear polarization NMR investigation of advanced pharmaceutical formulations, Id., section 1, Introduction, $4^{th}$ last paragraph. Soltesova et al. goes on to describe Bruker's solution, see " . . . and Bruker, using the design developed by Peter Gor'kov . . . decided to develop a 400 MHz widebore 3.2 mm MAS HFX DNP probe with $^{19}F$ and $^{1}H$ resonating on two separate coils—the outer coil tunable to $^{1}H$, the inner one tuning to 19F and X nuclei.", Soltesova et al., Id, section 1, Introduction, $3^{rd}$ last paragraph. Soltesova et al. conclude regarding the Bruker solution " . . . tuning the two frequencies is little user-friendly and it comes at the expense of RF sensitivity. This is because every additional RF component in the line comes with some insertion loss, and it is therefore preferable to reduce their number to a minimum.", Soltesova et al., Id, section 1, Introduction, $4^{th}$ last paragraph.

FIG. 1 shows a prior art Bruker probe circuit 1000 from Lim et al., U.S. Pat. No. 6,933,725 entitled NMR Probe Circuit for Generating Close Frequency Resonances for a probe that monitors two high frequency resonances corresponding to $^{1}H$ and $^{19}F$, and an additional resonance corresponding to $^{13}C$. The circuit shown in FIG. 1 is illustrative of Soltesova's comment that Bruker's approach is user unfriendly, lacks RF sensitivity and every additional RF component in the line comes with some insertion loss (see the sample inductor 110 the circuit shown in FIG. 1 contains numerous RF components (e.g., port 125 ($^{1}H$ resonance), port 122 ($^{19}F$ resonance), and port 126 ($^{13}C$ resonance), 118 ($^{13}C$ stop circuits), 113 ($^{1}H/^{19}F$ stop circuit), 115, 116 and 117 (matching capacitors), 114 (capacitor), 113 (stop circuit), 119, 121 (quarter wavelength resonators), 124, 123, (inserts), and 111, 112 (admittance inverters)).

Finally, regarding Soltesova et al.'s own design, Soltesova et al. conclude "Implementing two independently tunable channels for $^{1}H$ and $^{19}F$ on the other hand is more challenging regarding the probe's RF circuit but yields an improved NMR performance and it is easy to use.", Soltesova et al., Id and_the " . . . . DNP HFX probe equipped with two separate radiofrequency channels for $^{1}H$ and $^{19}F$ nuclei, representing a notable advantage over commonly acquired direct-detected $^{19}F$ experiments.", Soltesova et al., Id, section 4 Conclusion, $1^{st}$ sentence. That is, Soltesova et al., find their own approach of not simultaneously measuring $^{1}H$ and $^{19}F$ channels challenging but resulting in improved performance.

SUMMARY OF THE INVENTION

In an embodiment of the present invention, where a sample coil in a first circuit is inductively coupled to a loop gap coil in a second circuit, a third circuit can be used to adjust the splitting of the loop gap coil to the sample coil, where the third circuit includes one or both a resistance and/or a reactant to adjust the splitting.

In an embodiment of the present invention, where a sample coil in a first circuit is inductively coupled to a loop gap coil in a second circuit, a third circuit can be used to adjust the splitting of the loop gap coil to the sample coil, a third circuit can be used to adjust the splitting of a loop gap coil to a sample coil, where the third circuit includes an inductor to couple to the loop gap coil to adjust the splitting.

In an embodiment of the present invention, a reduction in the CFF can be achieved by introducing the third circuit to adjust the splitting of the loop gap coil to the sample coil, where the third circuit includes one or both a resistance and a reactant to adjust the splitting.

In an alternative embodiment of the present invention, the reduction in the CFF can be achieved by introducing a third circuit to adjust the splitting of the loop gap coil to the sample coil, where the third circuit includes an inductor to couple to the loop gap coil to adjust the splitting.

In an embodiment of the present invention, the reduction in the CFF can be achieved by introducing a third circuit to adjust the splitting of the loop gap coil to the sample coil, where the third circuit includes a variable capacitor to adjust the splitting.

In an embodiment of the present invention, the variable capacitor in the second circuit can be set in the factory, and the third circuit can be fine-tuned by the user for the splitting needed from different samples. In an embodiment of the present invention, a variable capacitor in the third circuit can be used to fine-tune the splitting as needed from different samples.

In an alternative embodiment of the present invention, the reduction in the CFF can be achieved by introducing a third circuit to adjust the splitting of the loop gap coil inductor, where the third circuit includes a variable resistor to adjust the splitting.

In an embodiment of the present invention, the variable capacitor in the second circuit can be set in the factory, and the third circuit can be fine-tuned by the user for the splitting needed from different samples. In an embodiment of the present invention, a variable resistor in the third circuit can be used to fine-tune the splitting as needed from different samples.

In another alternative embodiment of the present invention, the reduction in the CFF can be achieved by introducing a third circuit to adjust the splitting of the loop gap coil inductor, where the third circuit includes a variable inductor to adjust the splitting.

In an embodiment of the present invention, the variable capacitor in the second circuit can be set in the factory, and the third circuit can be fine-tuned by the user for the splitting needed from different samples. In an embodiment of the present invention, a variable inductor in the third circuit can be used to fine-tune the splitting as needed from different samples.

In additional embodiments of the invention, the element (including one or more of a variable capacitor, a variable inductor, and a variable resistor) associated with the third circuit results in a modulation of the CFF in the second circuit. The element can be a variable resistor and a variable capacitor, or a variable inductor and a variable capacitor, or a variable resistor and a variable inductor. In various embodiments of the present invention, the only requirement for the element used to modulate the CFF in the second circuit is that it does not impact the ability to generate the resonance of two or more modes (e.g., $^{1}H$ and $^{19}F$).

BRIEF DESCRIPTION OF THE DRAWINGS

This invention is described with respect to specific embodiments thereof. Additional aspects can be appreciated from the Figures in which:

FIG. 3C shows the signal intensity DB(|S1,1|) versus the frequency for $^{19}F$ 3090 and $^{1}H$ 3092 based on the circuit shown in FIG. 3B, according to an embodiment of the invention;

FIG. 3D shows the CFF versus the frequency for $^{19}F$ 3094 and $^{1}H$ 3096 based on the circuit shown in FIG. 3B, according to an embodiment of the invention;

FIG. 9 shows Equation 1, Equations 2 and Equation 3.

DETAILED DESCRIPTION OF THE INVENTION

Definitions

Figure 1:
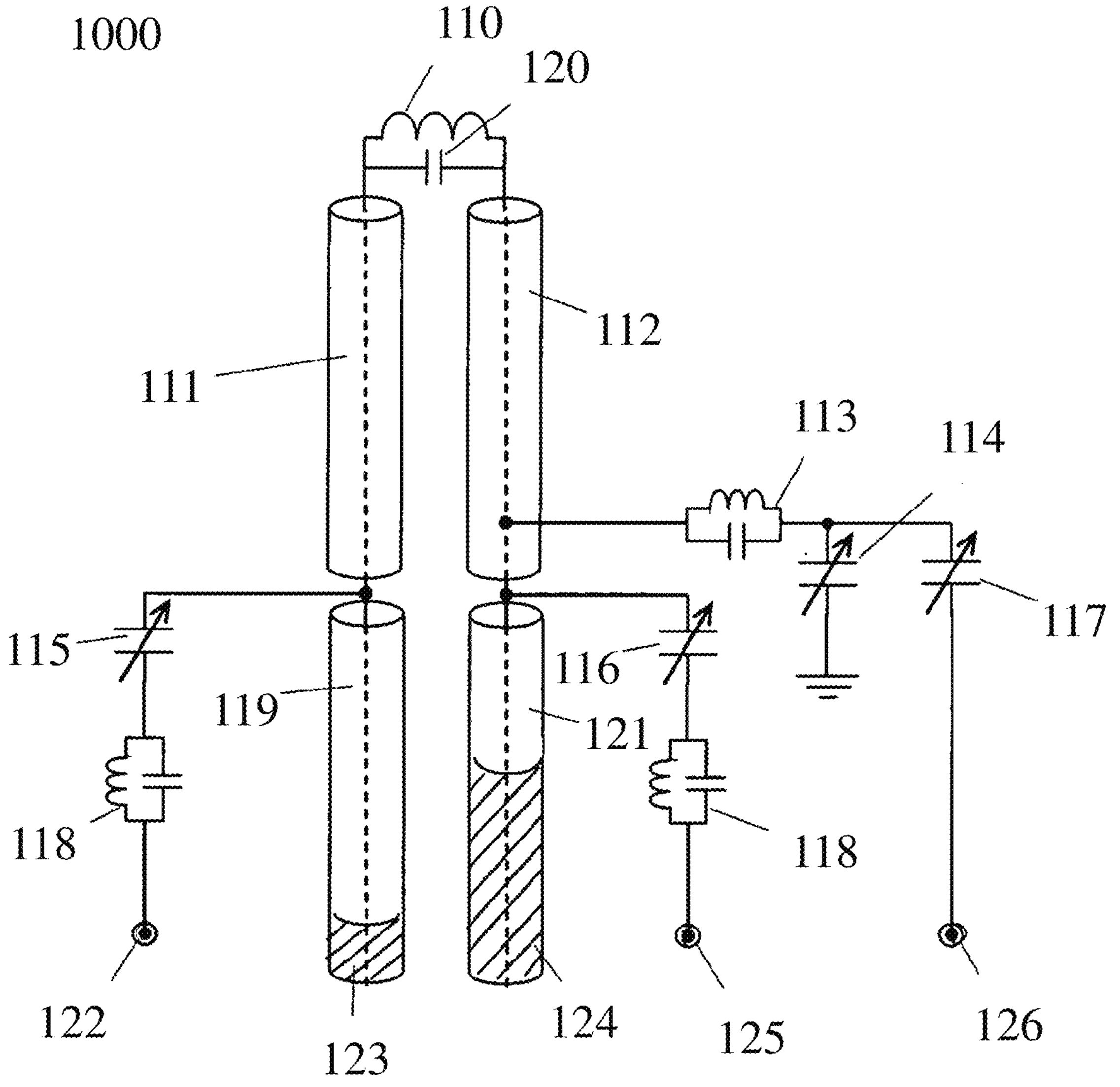
FIG. 1 PRIOR ART
FIG. 1 shows a prior art graphical depiction of a NMR probe with three resonators to create resonances intermediate to the resonator resonant frequencies for excitation of $^{1}H$ and $^{19}F$.

The transitional term 'comprising' is synonymous with 'including', 'containing', or 'characterized by', is inclusive or open-ended and does not exclude additional, unrecited elements or method steps.

The transitional phrase 'consisting of' excludes any element, step, or ingredient not specified in the claim, but does not exclude additional components or steps that are unrelated to the invention such as impurities ordinarily associated with a composition.

The transitional phrase 'consisting essentially of' limits the scope of a claim to the specified materials or steps and those that do not materially affect the basic and novel characteristic(s) of the claimed invention.

The phrase 'the NMR instrument' includes the magnet field characteristics of the NMR, e.g., the maximum magnet field intensity. The phrase 'the NMR probe' includes the size characteristics of the low temperature probe.

The Quality Factor (Q) is defined as the ratio of the energy stored in a component to the energy dissipated by the component. The unloaded Q ($Q_u$) is the measured Q without the load.

The phrases 'low temperature probe', 'ultra-low temperature probe', 'cryo-cooled probe', 'liquid nitrogen cooled probe', or 'low temperature cryo-cooled probe', mean an NMR probe that is adapted to be cooled to be used at temperatures below approximately 100° K. In this circumstance, approximately means plus or minus twenty (20) percent.

A thin foil is approximately cuboid and contains six surfaces of which four (4) of the surfaces are referred to as edges and two (2) of the surfaces are referred to as faces.

The term 'opposing edge' when used to refer to two articulated edges (each having approximately the same dimensions and area) as used herein means the edges formed (when the foil is adapted to form a capacitor) are in close proximity but not touching. The term 'opposing face' when used to refer to two articulated faces as used herein means the faces are in close proximity but not touching. In this circumstance, approximately means plus or minus five (5) percent tolerance.

The word 'exposed' as used herein means in the usual customary sense to an edge or a face of a metal that otherwise is not covered. Two opposing edges of a metal are not exposed.

A 'face is aligned but not touching another face' when each face has the same dimensions and area as an opposing face, and the face meets the opposing face such that the two faces are not touching over the area of the two faces.

A 'face of a foil capacitor' of a metal foil capacitor as used herein means in the usual customary sense to the largest area of the foil and excludes the two opposing edges, the top edge and the bottom edge. A 'surface of a foil capacitor' as used herein means in the usual customary sense to largest area of the foil and excludes the two opposing edges, the top edge and the bottom edge. In a foil with dimensions $4.1\times10^{-4}$ m$\times10^{-2}$ m$\times6.0\times10^{-2}$ m, the surface area of the side of a foil capacitor is approximately $2.4\times10^{-4}$ m$^2$.

The phrase 'low inductance probe' as used herein means in the usual customary sense to a probe with a sample coil inductance of less than approximately $1\times10^{-7}$ H. In this circumstance, approximately means plus or minus twenty (20) percent.

The word 'deployed' as used herein means in the usual customary sense to attached, affixed, adhered, inserted, located or otherwise associated.

A 'cell' as used herein means in the usual customary sense to a vessel such as a sample tube used to contain one or more of a homogeneous or heterogeneous liquid, gas or solid sample.

Figure 3A:
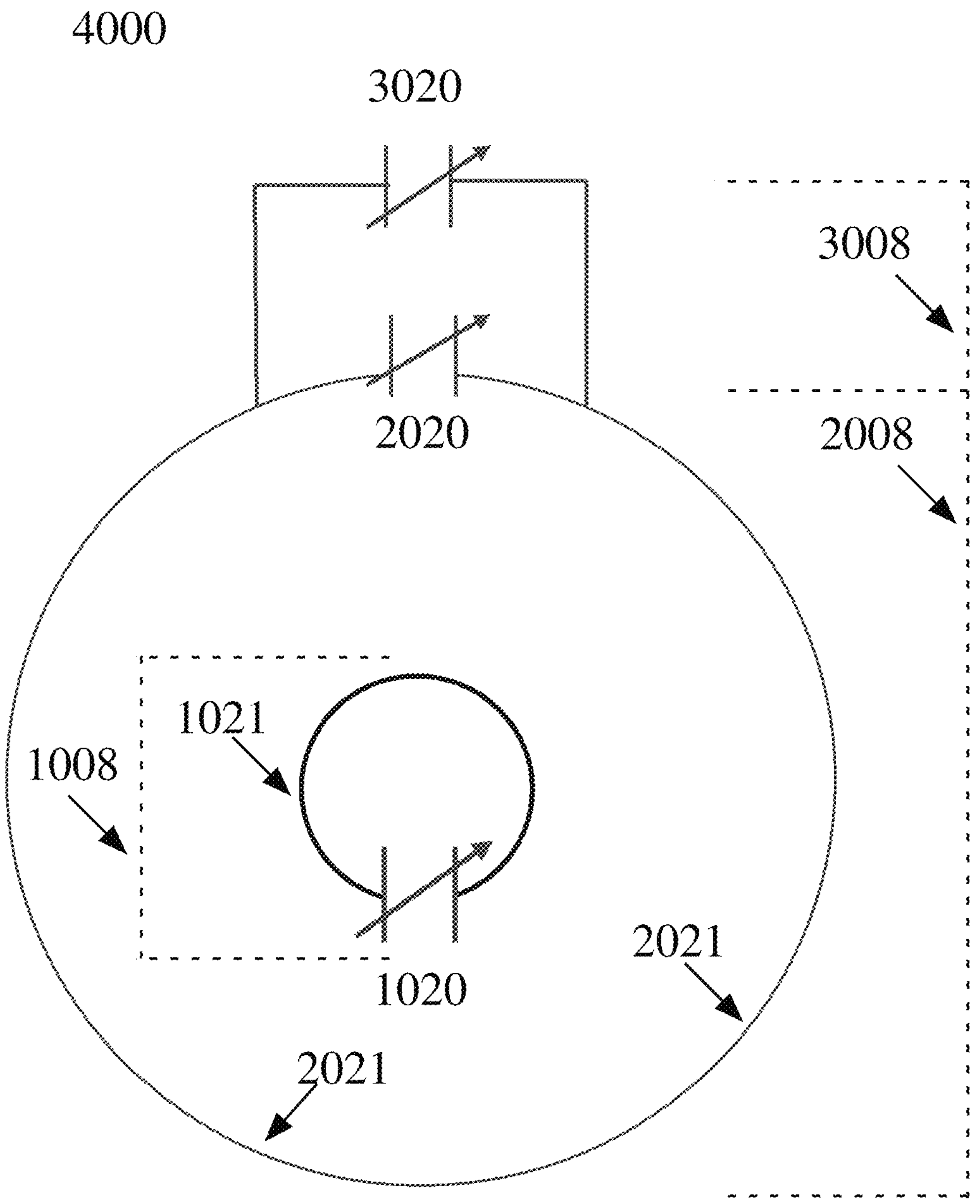
FIG. 3A is a schematic diagram 4000 showing a first circuit (1008) (with a sample coil 1021 and a variable capacitor 1020), a second circuit (2008) (with a loop gap coil 2021 and a variable capacitor 2020), and a third circuit (3008) (with a variable capacitor 3020), where the loop gap coil 2021 in the second circuit 2008 is inductively coupled to the sample coil 1021 in the first circuit 1008, where the splitting of the loop gap coil 2021 can be reduced through the variable capacitor 3020 in the third circuit 3008 which reduces the CFF of the second circuit 2008, according to an embodiment of the invention.
Figure 3B:
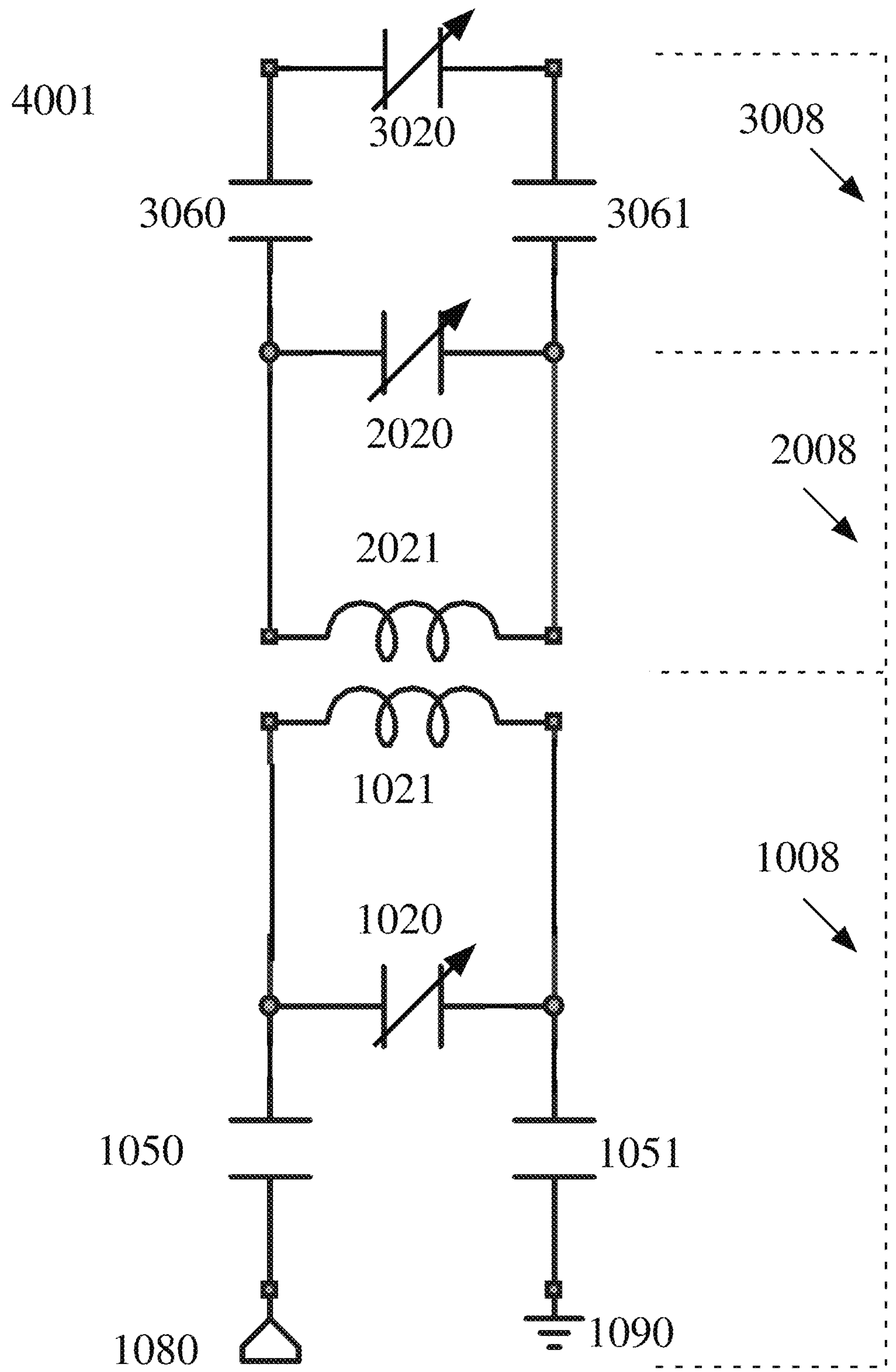
FIG. 3B is a circuit diagram 4001 according to FIG. 3A showing a first circuit (1008) (with a sample coil 1021 and a variable capacitor 1020), a second circuit (2008) (with a loop gap coil 2021 and a variable capacitor 2020), and a third circuit (3008) (with a variable capacitor 3020), where the loop gap coil 2021 in the second circuit 2008 inductively couples with the sample coil 1021 in a first circuit 1008, where the splitting of the loop gap coil 2021 to the sample coil 1021 in the first circuit 1008, can be reduced through a variable capacitor 3020 in the third circuit 3008 reducing the CFF of the second circuit 2008, according to an embodiment of the invention.

A 'first circuit' or a 'sample circuit' as used herein means e.g., the circuit 1008 in FIG. 3B comprising the sample coil 1021, port 1080, ground 1090, and capacitors 1020, 1030, 1031.

The phrase 'sample coil' or 'sample detection coil' as used herein means in the usual customary sense to an inductor in a first circuit surrounding the sample.

Coupling to various coils of different sizes and functions can be used to optimize a circuit. A sample coil, a coupling coil, a loop gap coil, a lock coil, and a detector coil can be solenoidal coils.

The word 'removed' as used herein means in the usual customary sense that the frequency is above or below the nominal frequency (e.g., f1 or f2 and the like). If f1 is 470 MHz, then a frequency 1% removed from f1 means less than 465.3 MHz or greater than 474.7 MHz. If f2 is 500 MHz then a frequency 1% removed from f2 means less than 495 MHz or greater than 505 MHz.

The phrase 'level of splitting is not optimized' as used herein means in the usual and customary sense that the frequency before being 'tuned' with the element of the third circuit, which means for a circuit as shown in FIG. 3B, 4B, 5B or 6B and a sample comprising at least two nuclei n1 and n2, where f1 is a lower resonance frequency of n1, where f2 is a lower resonance frequency of n2, where f2 is >f1, (i) adjusting the sample coil frequency to approximately (f2+f1)/2 if n=19F, and f1=470 MHz, and if n2=$^{1}$H, and f2=500 MHz, then (f2+f1)/2=485 MHz (where approximately in this range means plus or minus 5000 p.p.m., or 5% or 460.8 MHz and 509.2 MHz (485±24.2 MHz)) or (ii) adjusting the first variable capacitor such that the lower resonance frequency of n1 is at least 1% removed from f1, and the upper resonance frequency of n2 is at least 1% removed from f2, which means, if n=19F, and f1=470 MHz, then 'at least 1% removed from f1' means a frequency less than 465.3 MHz or a frequency greater than 474.7 MHz, and if n2=1H, and f2=500 MHz, then 'at least 1% removed from f2' means a frequency less than 495 MHz or a frequency greater than 505 MHz.

The phrase 'level of splitting is optimized' as used herein means in the usual and customary sense that the frequency after being 'tuned' with the element of the third circuit, which means for a circuit as shown in FIG. 3B, 4B, 5B or 6B and a sample comprising comprises at least two nuclei n1 and n2, where f1 is a lower resonance frequency of n1, where f2 is a lower resonance frequency of n2, where f2 is >f1, adjusting the element such that the lower resonance frequency of n1 is approximately 100% of f1 and the upper resonance frequency of n2 is approximately 100% of f2. Approximately in this range means plus or minus 100 p.p.m., or 0.1%. This means that if n=$^{19}$F, and f1=470 MHz, then 'approximately 100% of f1' means a frequency between 469.53 MHz and 470.47 MHz, if n2=1H, and f2=500 MHz, then 'approximately 100% of f2' means a frequency between 499.5 MHz and 500.5 MHz.

The phrase 'monitored resonance frequency' as used herein means in the usual customary sense to the specific frequency of radio-frequency radiation that the sample is exposed to under the magnetic field. In various embodiments of the invention, the monitored resonance frequency is set between the (two) different nuclei species resonance frequencies.

The phrase 'different nuclei species' (e.g. n1 and n2) as used herein means in the usual customary sense to the specific isotopes of elements that possess a non-zero intrinsic nuclear spin, (e.g., different $^{1}$H nuclei are not different nuclei species, whereas $^{1}$H nuclei and $^{19}$F nuclei are different nuclei species).

The word 'excitation' describes the disruption of the alignment of spins of nuclei in a sample in a static magnetic field ($B_0$) which occurs by applying an RF pulse at the Larmor frequency of the spins perpendicular to the magnetic field ($B_1$).

The word 'performance' as used herein means in the usual customary sense to the SNR of a circuit with respect to the parent mode(s).

The word 'mode' as used herein means in the usual customary sense to a resonance in the circuit.

The words or phrases 'coupling', 'coupling modes', 'detecting' or 'detecting modes' as used herein means in the usual customary sense to adjusting the resonance frequency of the loop gap coil 2021 relative to the sample coil 1021.

The phrase 'first circuit' as used herein means the circuit comprising the sample coil.

The phrase 'second circuit' or 'loop gap circuit' as used herein means the circuit comprising the loop gap coil, e.g., the circuit 2008 in FIG. 3B comprising the lop gap coil 2021, and capacitor 2020.

The phrase 'third circuit' as used herein means a circuit used to modulate the current flowing through the second circuit e.g., the circuit 3008 in FIG. 3B comprising the variable capacitor 3020, and capacitors 3060 and 3061. In an alternative embodiment of the invention, one or both capacitors 3060 and 3061 can be replaced with a small inductance inductor. In an embodiment of the invention, using a third circuit to modulate the current flowing through the second circuit, can be used to adjust the coupling between the first circuit and the second circuit.

The phrase 'coupling coil' as used herein means in the usual customary sense to an inductor in a third circuit surrounding the loop gap circuit (e.g., 3021).

The phrase 'loop gap coil' as used herein refers to an inductor (e.g., 2021 shown in FIG. 3A) in a second circuit which can inductively couple to the sample coil (e.g., 1021 shown in FIG. 3A).

The phrase 'inductively couple' as used herein means in the usual customary sense transferring energy or signals between coils through magnetic fields, without direct electrical connection. Inductive coupling is the near field wireless transmission of electrical energy between two inductively (magnetically) coupled coils.

The word 'near' refers to the position of the sample relative to the sample coil. The SFF is maximized by having the sample coil as close to the sample as physically possible.

In a first circuit comprising a sample coil, measurement of the resonance of two frequencies (e.g., $^{1}$H and $^{19}$F) can be desired. A limitation of using a loop gap coil in a second circuit to measure the sample coil resonance of two frequencies is that the loop gap coil must be able to couple to the sample coil, and it must have a coupling constant that produces two modes that are separated by at least the difference between the two frequencies for that magnet strength. From a practical perspective being able to precisely place a second circuit comprising a loop gap coil that will have a coupling constant with the sample coil that allows for simultaneous observation of $^{1}$H and $^{19}$F without further adjustment once the loop gap coil is situated is unrealistic. Hence, a mechanism to adjust the splitting of the two-inductor pairs is warranted. Surprisingly, it has been found that the addition of a third circuit allows for simultaneous observation of $^{1}H$ and $^{19}F$ without further adjustment of the current in the second circuit, allowing adjustment of the current in the third circuit to thereby modulate the splitting.

The splitting of the two modes in the sample coil is related to the CFF (see Equation 3), i.e. how much of the current flowing in the loop gap coil inductor couples to the sample coil. If the CFF can be modulated, then the splitting between the two coils can be adjusted. Accordingly, the splitting can be decreased by reducing the CFF of the loop gap coil. One mechanism to decrease the splitting would be to have a section of the second circuit (containing the loop gap coil) that doesn't couple to the sample coil, i.e. the second circuit produces B1 flux that doesn't couple to the sample coil (the first circuit). If the current in this segment of the second circuit is regulated such that little current is flowing in the segment, then the CFF can remain significantly unaltered. When the current flowing in this segment of the second circuit is modulated, the CFF is also modulated, since the B1 flux of the loop gap coil is adjusted and hence the splitting between the sample coil inductor and the loop gap coil inductor can be adjusted. Clearly, the sample coil and the loop gap coil must be resonant at the same frequency to create the two modes, i.e. the two (e.g., $^{1}H$ and $^{19}F$) frequencies. That is, the loop gap coil with its CFF adjustment must still satisfy this condition. However, the circuit associated with the reduction in the CFF is used to simply reduce the CFF of the loop gap coil (i.e., second) circuit.

The degree of coupling between the two inductors depends on the amount of sharing of magnetic flux between the two inductors and can be described by Equation 1 where $K_1$ is the coupling constant, M is the mutual inductance and L is the inductance of each coil.

To analyze the circuits, a CFF analysis was conducted. As shown in Equation 2, the SNR depends on the $CFF_{k,a}$. $CFF_{k,a}$ for the sample inductor (a) for the observed mode (k) and $Q_k$ is the Q of the kth mode.

The phrase 'Circuit Fill Factor (CFF)' means in the usual customary sense to for a specific mode, k, the definition of $CFF_{k,a}$ referred to a reference inductor, a is given by Equation 3, where $K_2$ is the constant of proportionality, a is the sample inductor, i is the current in the inductor, the j indices identify specific inductors, and it is implicit that the current values are for the kth mode.

The $CFF_{k,a}$ is a measure of the efficiency of a probe circuit. The $CFF_{k,a}$ determines for the kth mode of a circuit how much energy is delivered to a specific inductor, a. Here the $CFF_{k,a}$ is a measure of the efficiency of the sample coil in the probe circuit. It is clear that this definition does not accommodate the presence of mutual inductance. It can be concluded from Equation 2 and Equation 3, that the presence of more than one inductor in the circuit dilutes the signal to noise ratio of the multiply tuned probe circuit.

Further, for probe circuits with multiple ground points there exist the question of what is the common ground point. If the ground points are not at the same potential as the common ground point, then each ground point is essentially an inductor to that common ground point and such a circuit generates the potential to dilute the $CFF_{k,a}$ of the circuit. Eliminating ground points 1090 that are not at the same potential is also highly desirable.

The phrase 'electrically connected' as used herein means in the usual customary sense a conductive link allowing electric current to flow between components, forming a circuit achieved through various components (e.g., wire nuts, soldering, plugs, and/or screw terminals), ensuring energy transmission from a source to a load.

The phrase 'the field strength of the magnetic field in the location remains essentially constant' as used herein means that the incremental change in the magnetic field is less than approximately 1 ppm. In this circumstance, approximate means plus or minus 0.1 ppm.

An NMR probe can include a sample, a sample detection coil/associated circuitry, a lock coil/associated circuitry, a pulsed field gradient, one or more coupling coils/associated circuitry, one or more fixed capacitors, one or more variable capacitors, a stator to support the sample, and the sample detection coil and a sliding band capacitor. Minimizing components in the sample region of the NMR probe can reduce perturbations of the magnetic field ($B_0$), the RF homogeneity and accordingly increase the signal to noise ratio.

As known in the art, the term S11 refers to the forward reflection of a first input port, which is a measure of the impedance match. The term S22 refers to the forward reflection of a second input port, which is a measure of the impedance match.

The word 'adjusted' when used in the phrase 'interaction between the sample coil 1021 and the loop gap coil 2021 is adjusted to a resonant condition' means the CFF for the circuit would show greater than approximately sixty (60) percent of the energy resides in the sample coil 1021. Approximately in this range means plus or minus twenty (20) percent.

Absent express recitation to the contrary, the term 'approximately' means a nominal value plus or minus ten (10) percent thereof.

In the NMR experiment, the relationship between SNR, Quality factor for a resonator k ($Q_k$), Sample Fill Factor (SFF) and Circuit Fill Factor ($CFF_{k,a}$) is given by Equation 2. The Quality factor is a dimensionless parameter defined as the ratio of the initial energy stored in the resonator to the energy lost in one radian of the cycle of oscillation.

According to Equation 2, in order to maximize the SNR, it is necessary to maximize $Q_k$, SFF and/or $CFF_{k,a}$. To maximize $Q_k$ is maximized by increasing the surface area of the conductor forming the resonator, thus a large surface area for the conductor in the sample coil is preferred. This usually is resolved by using a low inductance coil, i.e. similar to an Alderman-Grant coil. A measure of the SFF is the square of the ratio of the sample diameter divided by the diameter of the sample coil. Coils with larger surface areas generally result in slightly higher SFF values. In addition, the SFF can be maximized by having the sample coil as close to the sample as physically possible. Further, $CFF_{k,a}$ can be maximized by having the fewest inductors in the circuit as possible.

Previously, increasing SNR of an NMR experiment involved a paradigm whereby the CFF was increased. When not all the inductance of the circuit produced flux which coupled to the sample the CFF was lowered. Unexpectedly, in an embodiment of the present invention, a section of the loop gap coil circuit (i.e., the second circuit) is intentionally not coupled to the sample coil, i.e. the loop gap coil produces B1 flux that doesn't couple to the sample coil. That this can be used to improve SNR is unexpected. Decreasing the flux which couples to the sample would normally be considered to be deleterious to the SNR.

In designing a solid-state NMR probe, there are constraints on the placement of the second inductor. Firstly, the second inductor is able to couple to the sample coil. Secondly, the second inductor is on the interior of the stator. Thirdly, the second inductor has a coupling constant that produces two modes that are separated by at least the difference between the $^{1}H$ and $^{19}F$ frequencies for that magnet strength. It is not practical to precisely place a second inductor that will have a coupling constant with the sample coil that allows for simultaneous observation of $^{1}H$ and $^{19}F$ without further adjustment. Hence, a mechanism to adjust the splitting of the two-inductor pair is warranted. One way to do this is to recognize that the splitting of the loop gap coil 2021 to the sample coil 1021 is related to the CFF, i.e. how much of the current flowing in the loop gap coil 2021 couples to the sample coil 1021. If the CFF can be reduced, then this allows for a mechanism to adjust the splitting between the two coils.

Figure 2:
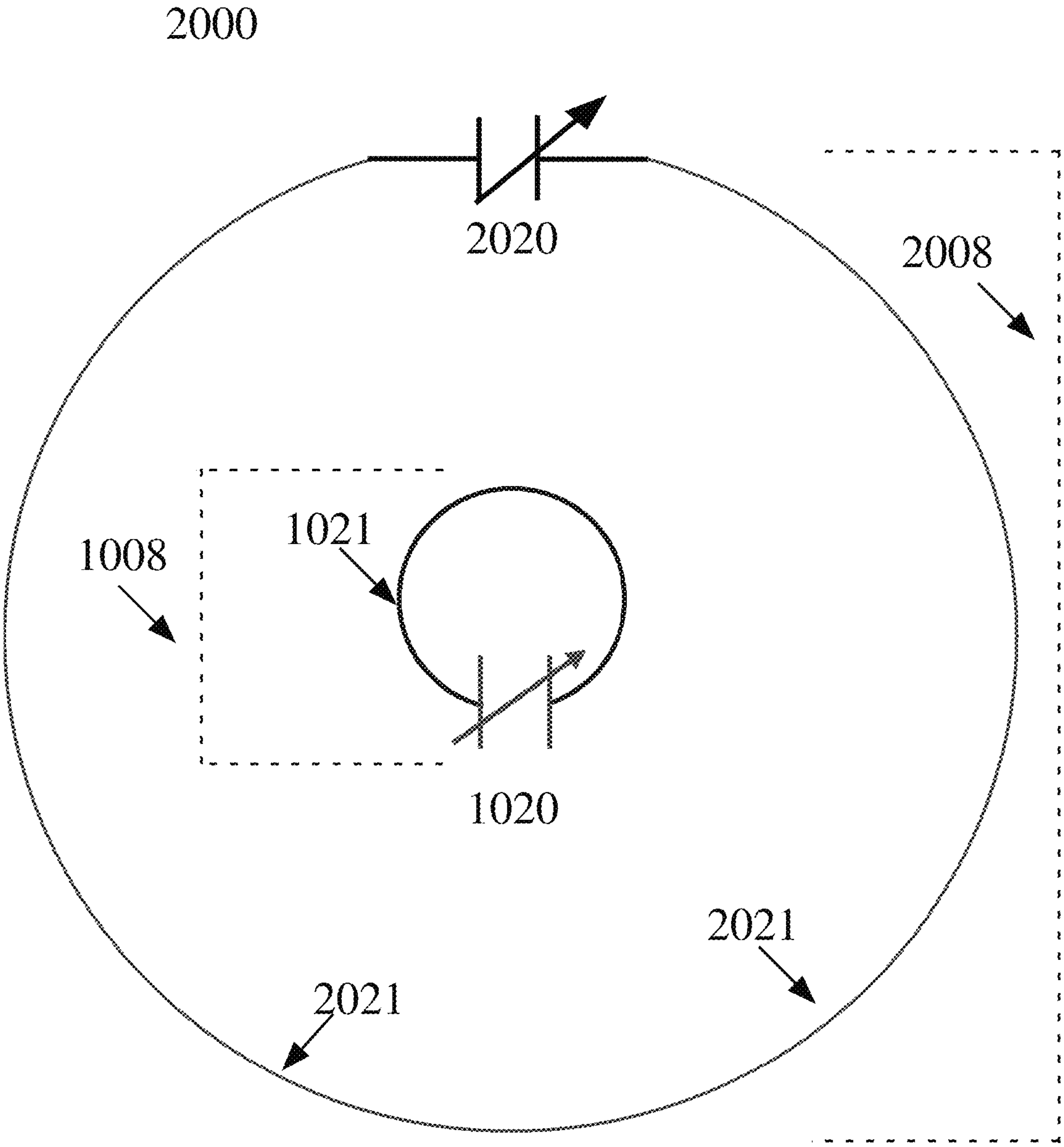
FIG. 2 PRIOR ART
FIG. 2 shows a prior art schematic diagram 2000 of a first circuit 1008 with a sample coil 1021 and a variable capacitor 1020, a second circuit 2008 with a loop gap coil 2021 and a variable capacitor 2020, where the two (2) inductors (the loop gap coil 2021 and the sample coil 1021) have coincident magnetic axes.

FIG. 2 is a schematic diagram 2000 showing a prior art set up with two (2) inductors (1021, 2021) which have coincident magnetic axis. In an embodiment of the present invention, each inductor consists of a single loop. In an alternative embodiment of the present invention, each inductor could also be a slice through the center of two inductors that have their magnetic axis on the same axis. Each inductor (1021, 2021) typically has an associated capacitor (not shown) that allows it to be tuned to a desired frequency. Because the inductors (1021, 2021) each have a component of their magnetic flux on the same axis, they couple due to this sharing. The degree of coupling depends on the amount of sharing of magnetic flux between the two inductors (see Equation 1). If each of these inductors is tuned to the same frequency, then the resonance is split into two modes and the separation of the modes is proportional to the coupling between the two resonators. In the embodiment shown in FIG. 2, the SNR is maximized by increasing the splitting between the loop gap coil and the sample coil. Unexpectedly, we have found that the SNR can be further increased (above what was obtained using the circuit shown in FIG. 2), by decreasing the splitting between the loop gap coil and the sample coil with the circuits shown in FIGS. 3B, 4B, 5B and 6B.

Assuming that the coupling constant is larger than desired, then the goal is to decrease the splitting by reducing the filling factor of the loop gap coil 2021.

One mechanism to do this would be to have a section of the second inductor that doesn't couple to the sample coil, i.e. it produces $B_1$ flux that doesn't couple to the sample coil. This can be accomplished by creating a second current path that doesn't couple to the sample coil 1021. The current in this segment of the inductor is regulated by a variable element such that when the variable element is at a minimum value there is little current flowing in the segment and hence the filling factor is not altered significantly. When the variable element is at its maximum value the current flowing in this segment is maximized and hence the filling factor is reduced since the $B_1$ flux of the outside inductor is reduced and hence the splitting between the two inductors is decreased.

FIG. 3A is a schematic diagram 4000 showing a first circuit (1008), a second circuit (2008), and a third circuit (3008), where a loop gap coil 2021 in the second circuit 2008 is inductively coupled to the sample coil 1021 in the first circuit 1008, where the splitting of the loop gap coil can be reduced through a variable capacitor 3020 in the third circuit 3008 which reduces the CFF of the second circuit 2008.

FIG. 3B is a circuit diagram 4001 based on FIG. 3A in which the circuit comprises a loop gap coil 2021 (and a variable capacitor 2020) in a second circuit 2008 inductively coupled with a sample coil 1021 (and capacitors 1050, 1051 and 1020) in a first circuit 2008, where the splitting of the loop gap coil 2021 in the second circuit 2008 to the sample coil 1021 in the first circuit 1008 can be decreased through a variable capacitor 3020 in a third circuit 3008 reducing the CFF of the second circuit 2008 (where the $^{1}H$ and 19F channel can be measured at 1080, where Z=50 Ohm, and 1090 is ground). Accordingly, the circuit 4001 comprises the first circuit 1008, second circuit 2008 and third circuit 3008.

It is noted that the third circuit can also comprise capacitors 3060 and 3061 (and that 3060 and 3061 can correspond to the leads used to connect the third circuit to the second circuit). In an alternative embodiment of the invention, one or both capacitors 3060 and 3061 can be replaced with a small inductance inductor. In an embodiment of the present invention, the variable capacitor 2020 can be set in the factory, and the inductance of the loop gap coil 2021 in the second circuit can be fine-tuned using the variable capacitor 3020 in the third circuit 3008 to adjust for the splitting needed from different samples (e.g., the variable capacitor 3020 can be set in a laboratory). In an embodiment of the invention shown in FIG. 3B, the splitting of the loop gap coil 2021 can be decreased through the variable capacitor 3020 in a third circuit 3008 decreasing the CFF of the second circuit 2008. By having two (2) variable elements (2020 and 3020) around the stator, two (2) different current paths are generated. It is noted that circuit 4001 contains two (2) capacitors (3020, 2020) in parallel and as such when the capacitance of the variable capacitor (3020) in the third circuit is at a minimum, the splitting of the loop gap coil 2021 to the sample coil 1021 is at a minimum. Whereas when the capacitance of the variable capacitor (3020) in the third circuit is increased, the splitting of the loop gap coil 2021 to the sample coil 1021 is increased. The two (2) variable elements allow the desired splitting to be generated. This allows the CFF to be adjusted for the loop by dialing in the efficiency.

It is important to recognize that the two inductors (1021, 2021) must be resonant at the same frequency to create the two modes, e.g., the $^{1}H$ and $^{19}F$ frequencies. The loop gap coil 2021 with its filling factor adjustment must satisfy this condition.

It is also important to recognize that the variable capacitor 3020 in the third circuit, associated with reduction in the CFF, is used here to simply reduce the CFF of the second circuit 2008. In various embodiments of the present invention, other elements can be used to adjust the splitting between the loop gap coil and the sample coil, such as a variable inductor (see also FIGS. 4A and 4B), a variable resistor (see also FIGS. 5A and 5B), or inductive coupling (see also FIGS. 6A and 6B). The only requirement for the element being the reduction of the CFF and that it does not impact the ability to generate the necessary two modes.

FIG. 3C shows the signal intensity DB(|S1,1|) versus the frequency for $^{19}F$ 3090 (470 MHz, −27.3 dB) and $^{1}H$ 3092 (500 MHz, −25.5 dB) based on the circuit shown in FIG. 3B. FIG. 3D shows the CFF versus the frequency for $^{19}F$ 3094 (470 MHz, CFF=0.5266) and $^{1}H$ 3096 (500 MHz, CFF=0.4726) (corresponding to FIG. 3C and based on the circuit shown in FIG. 3B). FIG. 3D shows that the energy in each of the two (2) modes is approximately equivalent (where approximately in this range means plus or minus 5%).

Figure 4A:
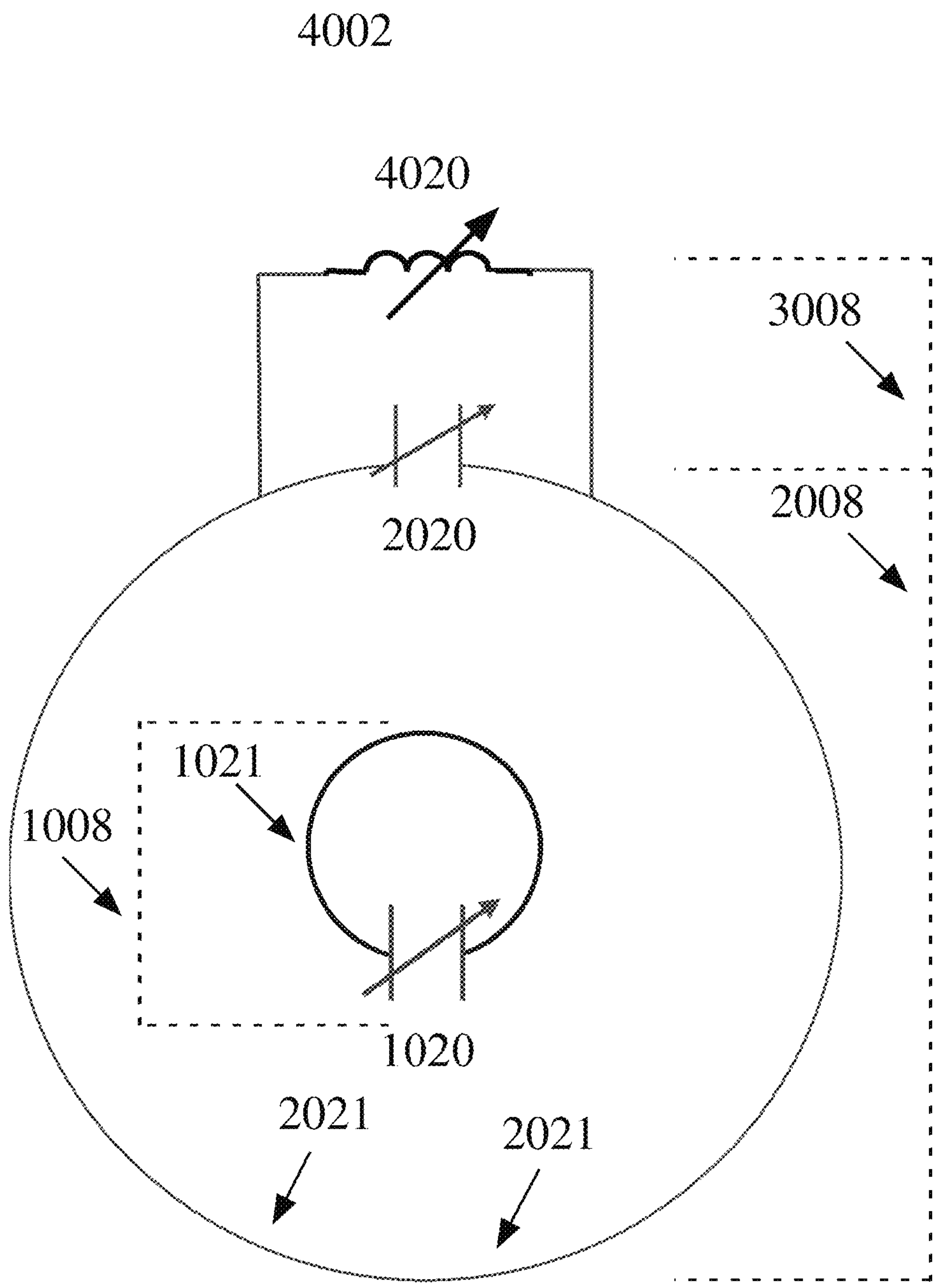
FIG. 4A is a schematic diagram 4002 showing a first circuit (1008) (with a sample coil 1021 and a variable capacitor 1020), a second circuit (2008) (with a loop gap coil 2021 and a variable capacitor 2020), and a third circuit (3008) (with a variable inductor 3021), where the loop gap coil 2021 in a second circuit 2008 inductively couples to the sample coil 1021 in the first circuit 1008, where the splitting of the loop gap coil 2021 can be modified through a variable inductor 4020 in a third circuit 3008 reducing the CFF of the second circuit 2008, according to an embodiment of the invention.

FIG. 4A is a schematic diagram 4002 showing a variable loop gap coil 2021 in a second circuit 2008 inductively coupled to the sample coil 1021 in a first circuit 1008, where the splitting of the variable loop gap coil 2021 can be reduced through a variable inductor 4020 in the third circuit reducing the CFF of the second circuit 2008. By having two (2) variable elements (2020 and 4020 in FIG. 4A) around the stator, two (2) different current paths are generated. The two (2) variable elements (2020 and 4020) allow the desired splitting to be generated. This allows the CFF to be adjusted for the loop by dialing in the efficiency.

Figure 4B:
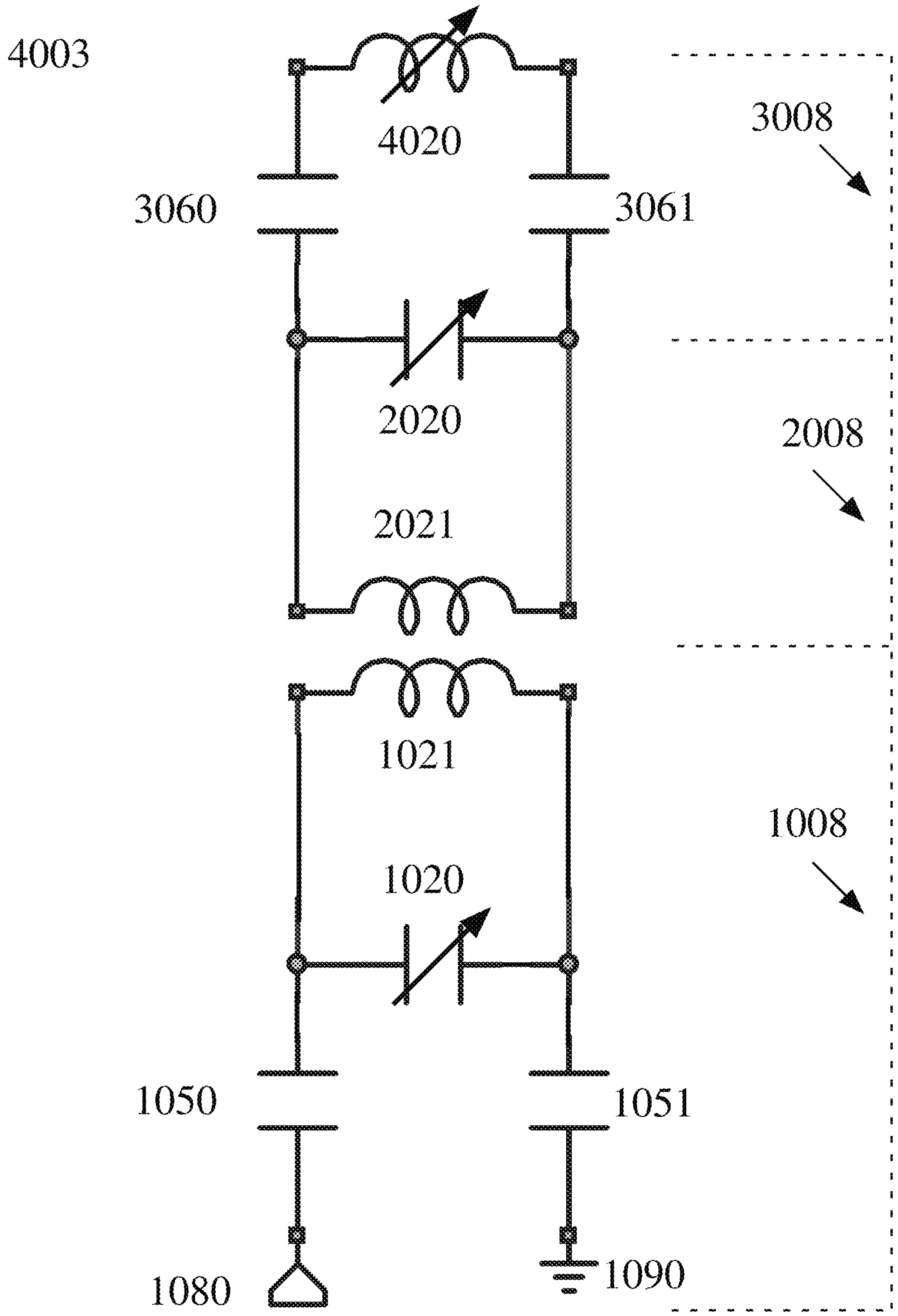
FIG. 4B is a circuit diagram 4003 according to FIG. 4A showing a first circuit (1008) (with a sample coil 1021 and a variable capacitor 1020), a second circuit (2008) (with a loop gap coil 2021 and a variable capacitor 2020), and a third circuit (3008) (with a variable inductor 4020), where the loop gap coil 2021 in the second circuit 2008 inductively couples with the sample coil 1021 in the first circuit 1008, where the splitting of the loop gap coil 2021 to the sample coil 1021 can be modified through the variable inductor 4020 in a third circuit 3008 reducing the CFF of the second circuit 2008, according to an embodiment of the invention.

FIG. 4B is a circuit diagram 4003 of an embodiment of the invention according to FIG. 4A, in which the circuit shows a loop gap coil 2021 in a second circuit 2008 inductively coupled with the sample coil 1021 in a first circuit 1008, where the splitting of the loop gap coil 2021 to the sample coil 1021 can be decreased through a variable inductor 4020 reducing the CFF of the second circuit 2008. The first circuit 2008 also comprises capacitors 1050, 1051 and 1020 (which can be variable) and together are adjusted for the frequency to be monitored. It is noted that the circuit 4003 comprises the first circuit 1008, the second circuit 2008 and the third circuit 3008.

In an embodiment of the present invention, the variable capacitor 2020 can be set in the factory, and the variable inductor 4020 in the third circuit can be fine-tuned for the splitting needed from different samples. The third circuit also includes capacitors 3060 and 3061 (and that 3060 and 3061 can correspond to the leads used to connect the third circuit to the second circuit, where the $^{1}$H and 19F channel can be measured at 1080, where Z=50 Ohm, and 1090 is ground). In an alternative embodiment of the invention, one or both capacitors 3060 and 3061 can be replaced with a small inductance inductor.

Figure 5A:
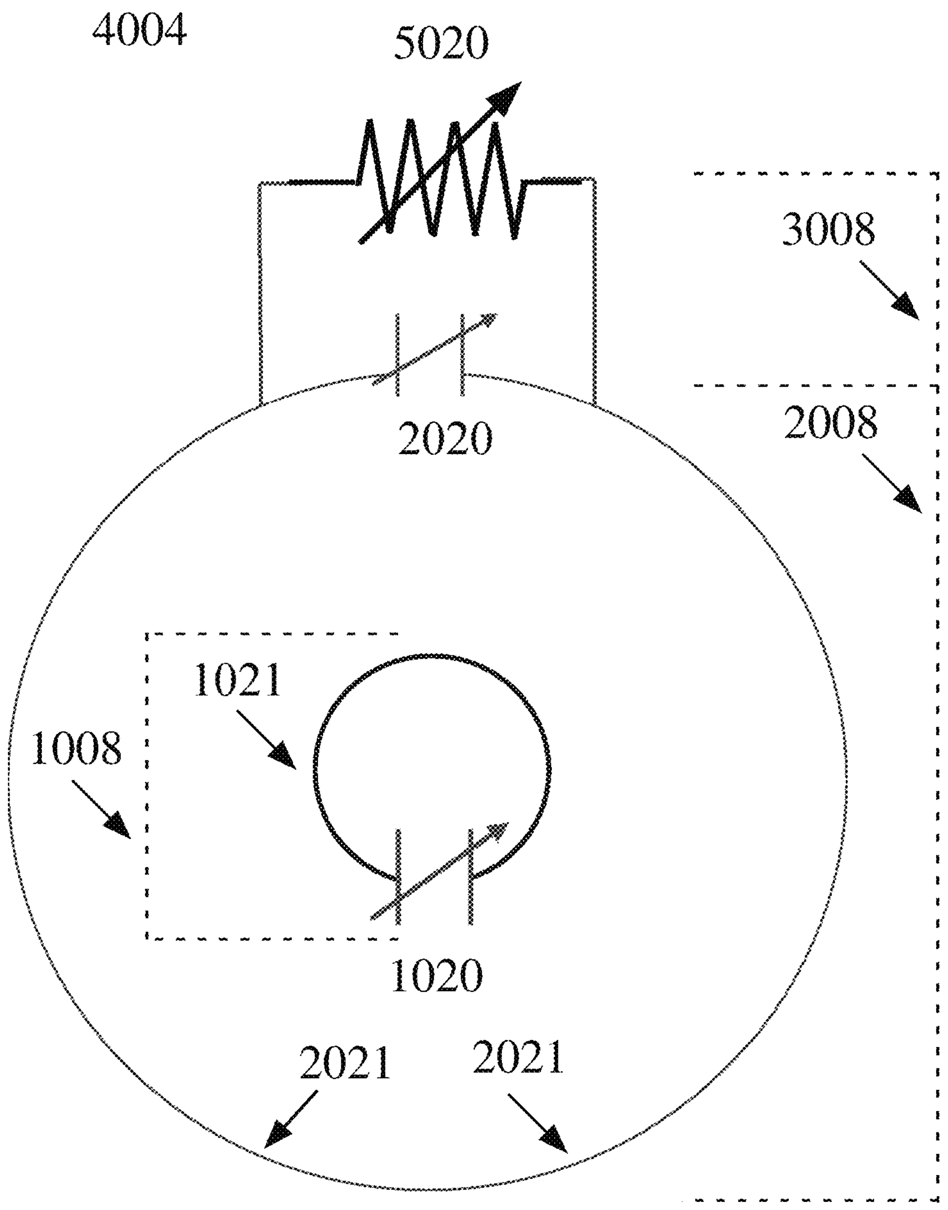
FIG. 5A is a schematic diagram 4004 showing a first circuit (1008) (with a sample coil 1021 and a variable capacitor 1020), a second circuit (2008) (with a loop gap coil 2021 and a variable capacitor 2020), and a third circuit (3008) (with a variable resistor 5020), where the loop gap coil 2021 in the second circuit 2008 inductively couples to the sample coil 1021 in the first circuit 1008, where the splitting of the loop gap coil 2021 can be modified through a variable resistor 5020 in a third circuit 3008 modifying the CFF of the second circuit 2008, according to an embodiment of the invention.

FIG. 5A is a schematic diagram 4004 showing a variable loop gap coil 2021 in a second circuit 2008 inductively coupled to the sample coil 1021 in a first circuit 1008, where the splitting of the loop gap coil 2021 can be reduced through a variable resistor 5020 reducing the CFF of the second circuit 2008. By having two (2) variable elements (2020 and 5020 in FIG. 5A) around the stator, two (2) different current paths are generated. The two (2) variable elements (2020 and 5020) allow the desired splitting to be generated. This allows the CFF to be adjusted for the loop by dialing in the efficiency.

Figure 5B:
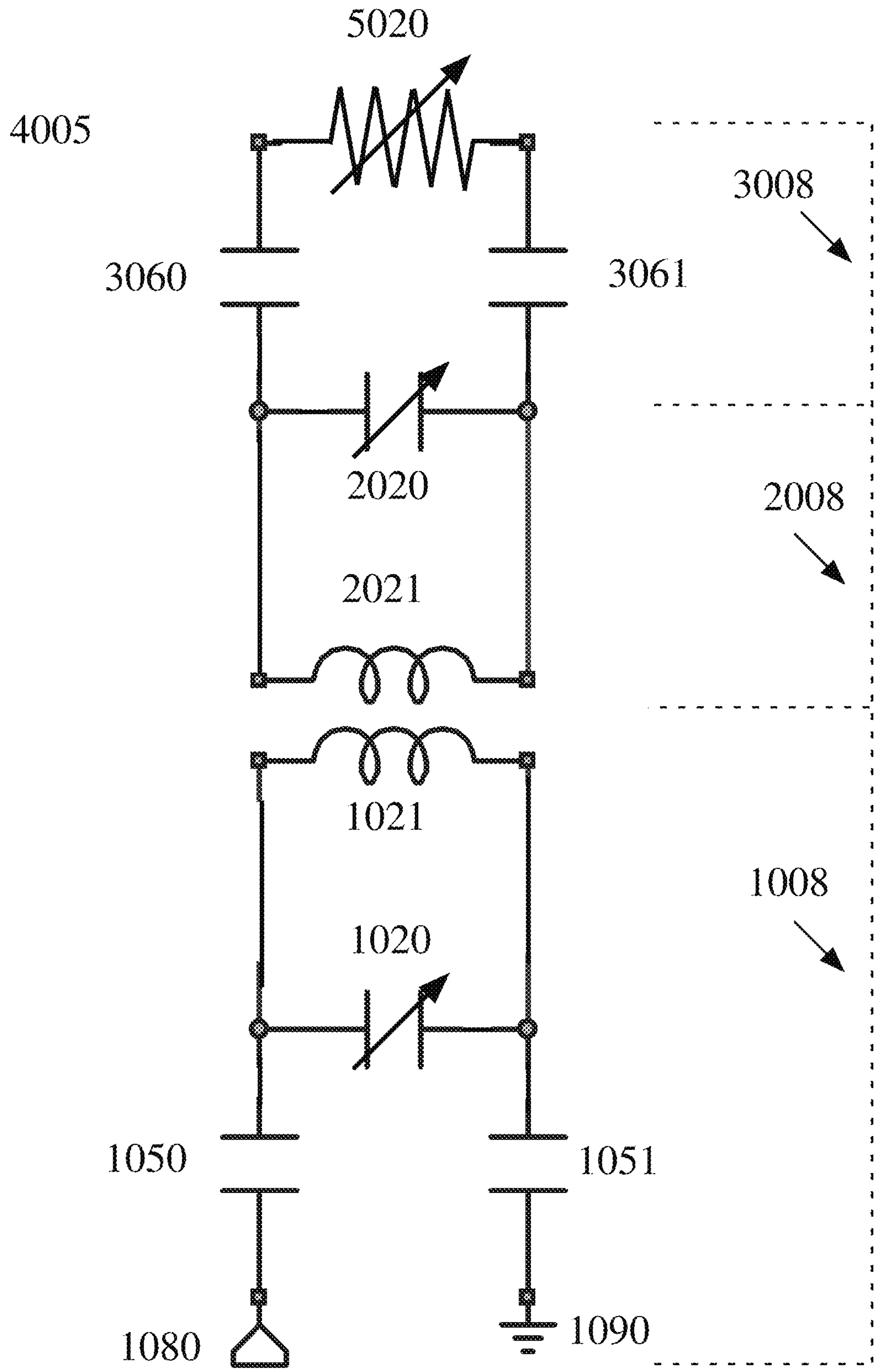
FIG. 5B is a circuit diagram of a circuit 4005 according to FIG. 5A showing a first circuit (1008) (with a sample coil 1021 and a variable capacitor 1020), a second circuit (2008) (with a loop gap coil 2021 and a variable capacitor 2020), and a third circuit (3008) (with a variable capacitor 3020), where the loop gap coil 2021 in the second circuit 2008 inductively couples with the sample coil 1021, where the splitting of the loop gap coil 2021 to the sample coil 1021 can be modified through a variable resistor 5020 modifying the CFF of the second circuit 2008, according to an embodiment of the invention.

FIG. 5B is a circuit diagram 4005 of an embodiment of the invention according to FIG. 5A, in which the circuit shows a loop gap coil 2021 in a second circuit 2008 inductively coupled with the sample coil 1021 in a first circuit 1008, where the splitting of the loop gap coil 2021 to the sample coil 1021 can be adjusted through a variable resistor 5020 adjusting the CFF of the second circuit 2008. The first circuit 2008 also comprises capacitors 1050, 1051 and 1020 (which can be variable) and together are adjusted for the frequency to be monitored. In an embodiment of the present invention, the variable capacitor 2020 can be set in the factory, and the variable resistor 5020 can be fine-tuned for the splitting needed from different samples. The third circuit also includes capacitors 3060 and 3061 (where 3060 and 3061 can correspond to the leads used to connect the third circuit to the second circuit, where the $^{1}$H and 19F channel can be measured at 1080, where Z=50 Ohm, and 1090 is ground). In an alternative embodiment of the invention, one or both capacitors 3060 and 3061 can be replaced with a small inductance inductor. It is noted that the circuit 4005 comprises the first circuit 1008, the second circuit 2008 and the third circuit 3008.

Figure 6A:
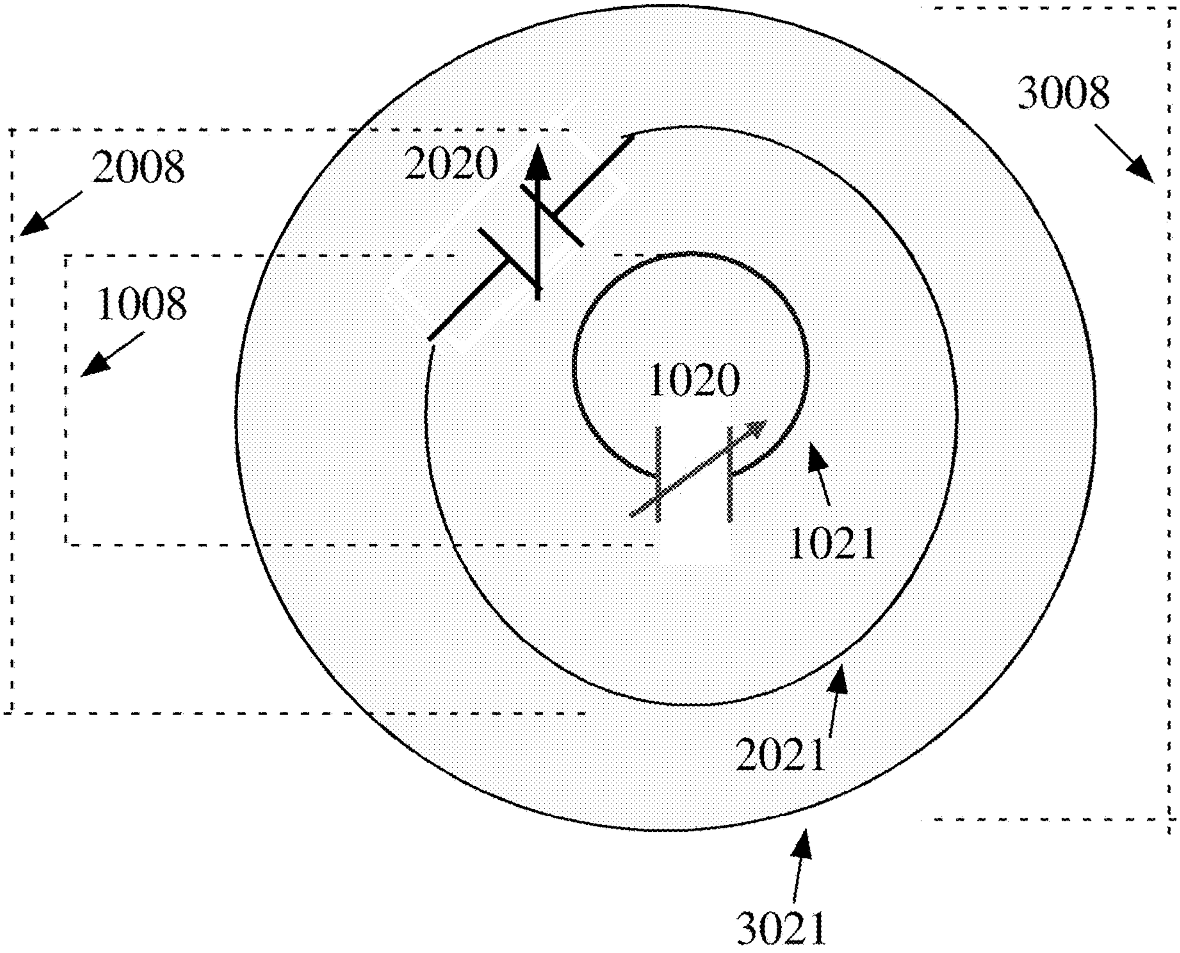
FIG. 6A is a schematic diagram 4006 showing a first circuit (1008) (with a sample coil 1021 and a variable capacitor 1020), a second circuit (2008) (with a loop gap coil 2021 and a variable capacitor 2020), and a third circuit (3008) with a coupling coil (3021), where the loop gap coil 2021 in the second circuit 2008 inductively couples to the sample coil 1021 in the first circuit 1008, where the splitting of the loop gap coil 2021 can be modified by the presence of a third circuit (3008) and inductive coupling to the coupling coil 3021, according to an embodiment of the invention.

FIG. 6A is a schematic diagram 4006 showing a loop gap coil 2021 in a second circuit 2008 inductively coupled to the sample coil 1021 in a first circuit 1008, where the splitting of the loop gap coil 2021 can be reduced through inductive coupling to a coupling coil 3021 of a third circuit 3008 reducing the CFF of the second circuit 2008.

Figure 6B:
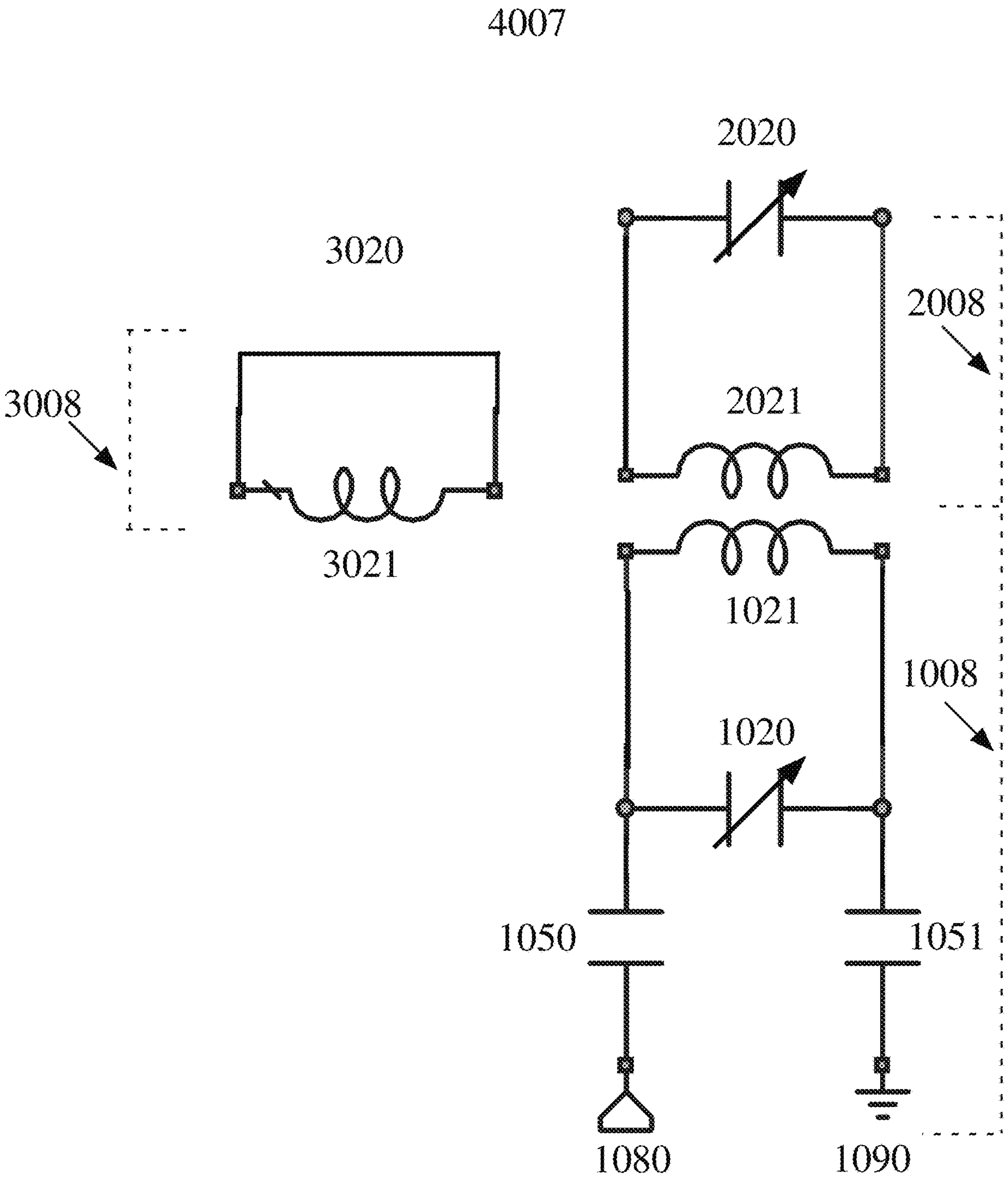
FIG. 6B is a circuit diagram of a circuit 4007 according to FIG. 6A showing a first circuit (1008) (with a sample coil 1021 and a variable capacitor 1020), a second circuit (2008) (with a loop gap coil 2021 and a variable capacitor 2020), and a third circuit (3008) with a coupling coil (3021), where the loop gap coil 2021 in the second circuit 2008 inductively couples with the sample coil 1021, where the splitting of the loop gap coil 2021 to the sample coil 1021 can be modified by the presence of a third circuit (3008) and inductive coupling to the coupling coil 3021, according to an embodiment of the invention.

FIG. 6B is a circuit diagram of a circuit 4007 according to FIG. 6A showing a loop gap coil 2021 in a second circuit 2008 inductively coupled with the sample coil 1021 in a first circuit 1008, where the splitting of the loop gap coil 2021 to the sample coil 1021 can be reduced through inductive coupling to a coupling coil 3021 of a third circuit 3008 reducing the CFF of the second circuit 2008.

Figure 7A:
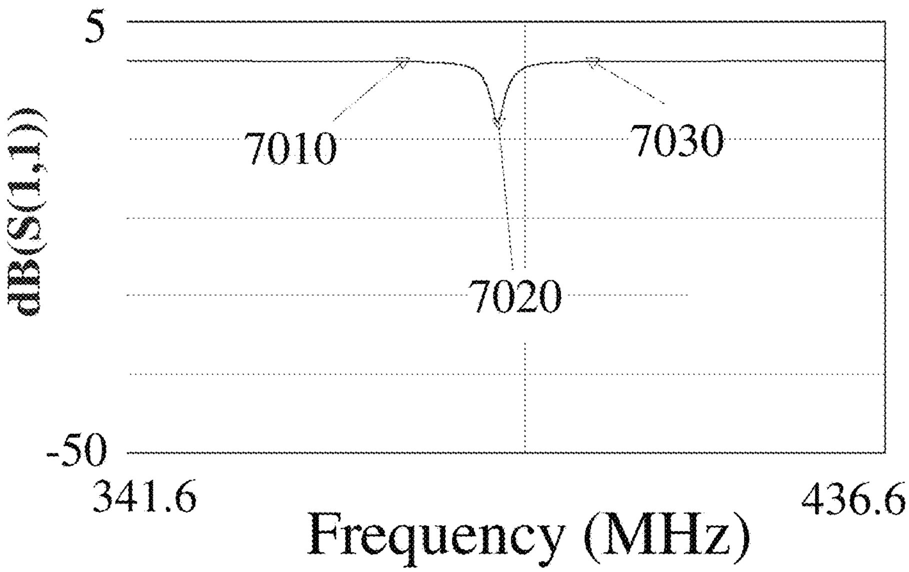
FIG. 7A shows the signal intensity DB(|S1,1|) versus the frequency for approximately 0% splitting of $^1$H and $^{19}$F, according to an embodiment of the invention.
Figure 7B:
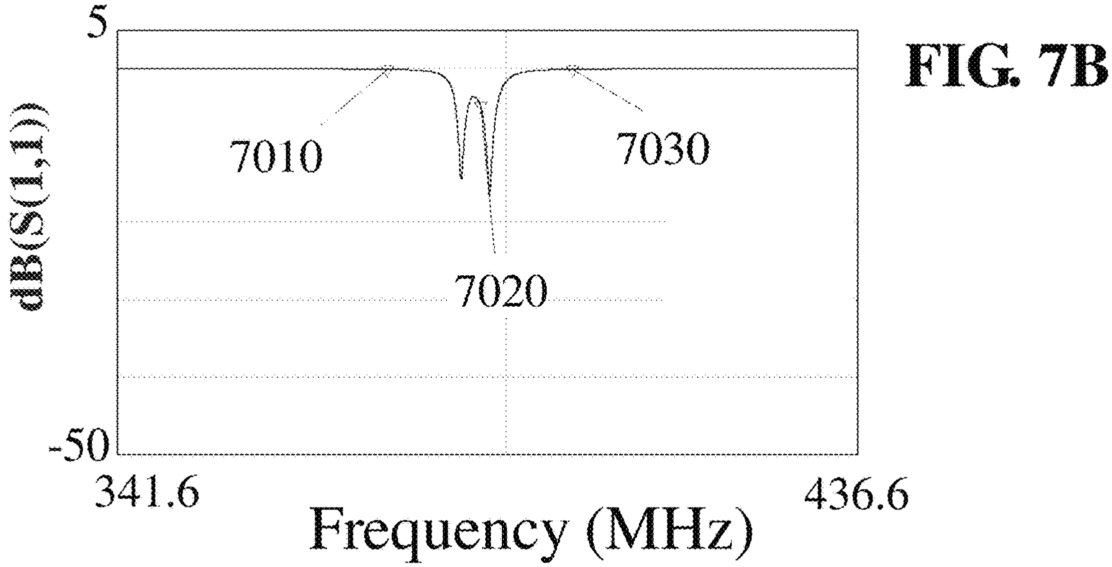
FIG. 7B shows the signal intensity DB(|S1,1|) versus the frequency for approximately 35% splitting of $^1$H and $^{19}$F, according to an embodiment of the invention.
Figure 7C:
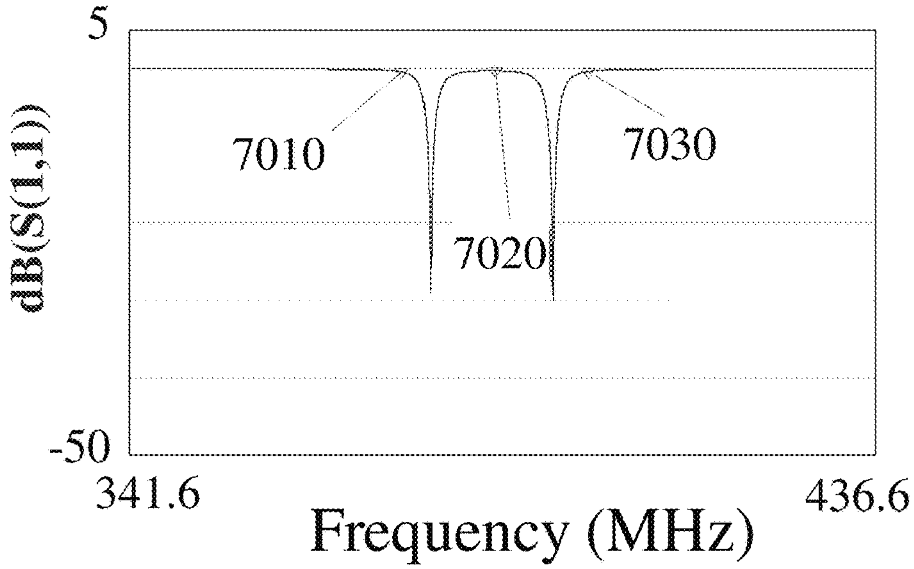
FIG. 7C shows the signal intensity DB(|S1,1|) versus the frequency for approximately 70% splitting of $^1$H and $^{19}$F, according to an embodiment of the invention.
Figure 7D:
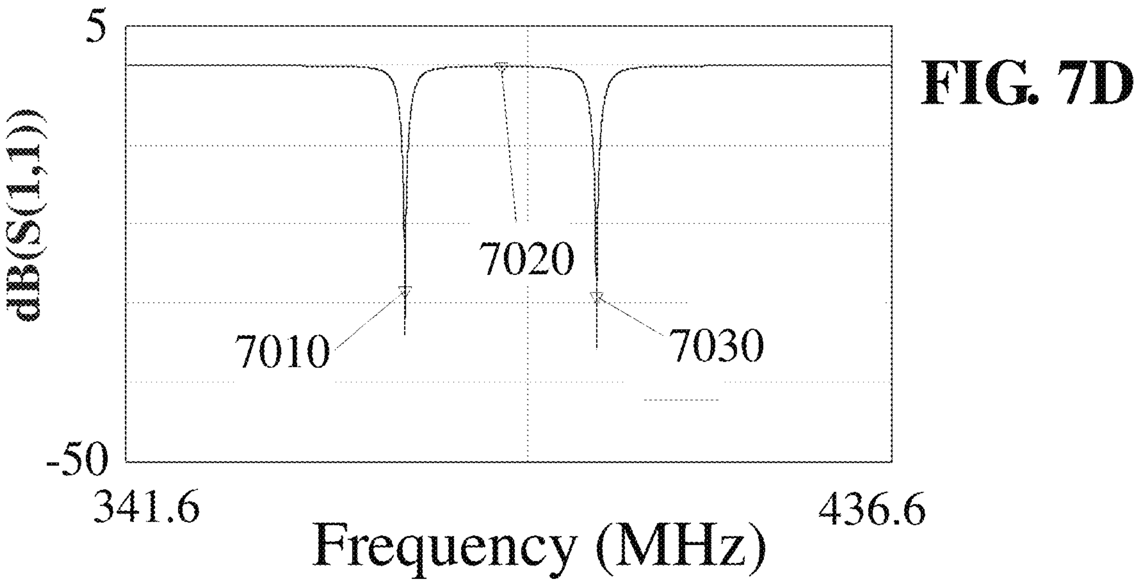
FIG. 7D shows the signal intensity DB(|S1,1|) versus the frequency for approximately 100% splitting of $^1$H and $^{19}$F, according to an embodiment of the invention.

Using a 9.4T NMR magnet the splitting into the two modes representing the resonance frequencies of $^{1}$H and $^{19}$F can be monitored as shown in FIGS. 7A-7D. Adjusting the splitting allows for simultaneous detection or excitation of the two ($^{1}$H and $^{19}$F) resonances. FIG. 7A shows the signal intensity DB(|S1,1|) versus the frequency based on the circuit shown in FIG. 3B for 376.23 MHz, −0.093 dB 7010, 399.95 MHz, −0.088 dB 7030 and a point chosen in between (388.14 MHz, 7020, −7.79 dB) to illustrate the splitting, where FIG. 7A shows approximately 0% splitting of $^{1}$H and $^{19}$F resonance frequencies. FIG. 7B shows the signal intensity DB(|S1,1|) versus the frequency based on the circuit shown in FIG. 3B for 376.23 MHz, −0.1 dB 7010, 399.95 MHz, −0.095 dB 7030 and the point in between (388.14 MHz, 7020, −4.75 dB) which shows approximately 35% splitting of $^{1}$H and $^{19}$F resonance frequencies. FIG. 7C shows the signal intensity DB(|S1,1|) versus the frequency based on the circuit shown in FIG. 3B for 376.23 MHz, −0.4258 dB 7010, 399.95 MHz, −0.3708 dB 7030 and the point in between (388.14 MHz, 7020, −2.71 dB) which shows approximately 70% splitting of $^{1}$H and $^{19}$F resonance frequencies. FIG. 7D shows the signal intensity DB(|S1,1|) versus the frequency based on the circuit shown in FIG. 3B for ($^{1}$H) 376.23 MHz, −028.38 dB 7010, ($^{19}$F) 399.95 MHz, −29.11 dB 7030 and the point in between (388.14 MHz, 7020, −0.1225 dB) which shows approximately 100% splitting of $^{1}$H and $^{19}$F resonance frequencies. Approximately in this range means plus or minus ten (10) percent.

Figure 8:
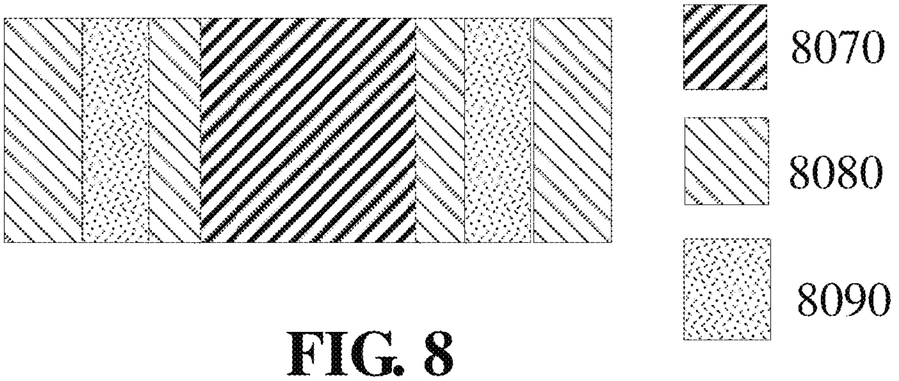
FIG. 8 shows a schematic representation of the splitting of the coupling loop 8090 the loop-gap coil 8070 and the sample coil 8080, according to an embodiment of the invention.

FIG. 8 shows a schematic representation of the splitting of a circuit shown in FIG. 6B, where the coupling loop 3021 in the third circuit is inductively coupled to the loop-gap coil 2021 (where the spitting of the loop gap coil is shown as 8070, the spitting of the sample coil is shown as 8080, and the spitting of the coupling loop is shown as 8090). In an embodiment of the invention, there can be one coupling loop 3021. In an alternative embodiment of the invention, there can be two or more coupling loops 3021.

The circuits shown in FIGS. 3B, 4B, 5B and 6B have several advantages over the prior art (FIG. 1 and FIG. 2). According to Equation 1, the splitting can be increased by reducing the length of the loop gap coil 2021. The loop gap coil 2021 can be wrapped around the sample coil. Accordingly, the splitting can be reduced by reducing the length of the loop gap coil 2021. In an embodiment of the present invention, where the sample coil is a long inductor (e.g., 8 mm Cu 3.7 mm id, the loop gap inductor can be foil wrapped around the inductor (e.g., 25 mm×8 mm×3000" Ag/Cu foil). The magnitude of the splitting is dependent on the values of L1 and L2 in Equation 1. In an embodiment of the present invention, where the sample coil L2 has an inductance of ~88 nH, the inductance of L1 was increased from 12.8 nH to 19.8 nH by decreasing the length of the cap-band from 20 mm to 10 mm. As a result, the splitting increases so that a 600 MHz version of the NMR probe can be used to simultaneously measure $^{1}$H and $^{19}$F channels.

In the following description, various aspects of the present invention are described. However, it will be apparent to those skilled in the art that the present invention can be practiced with only some or all aspects of the present invention. For purposes of explanation, specific numbers, materials, and configurations are set forth to provide a thorough understanding of the present invention. However, it will be apparent to one skilled in the art that the present invention can be practiced without the specific details. In other instances, well-known features are omitted or simplified in order not to obscure the present invention.

Parts of the description are presented in data processing terms, such as data, selection, retrieval, generation, and so forth, consistent with the manner commonly employed by those skilled in the art to convey the substance of their work to others skilled in the art. As is well understood by those skilled in the art, these quantities (data, selection, retrieval, generation) can take the form of electrical, magnetic, or optical signals capable of being stored, transferred, combined, and otherwise manipulated through electrical, optical, and/or biological components of a processor and its subsystems.

Various operations are described as multiple discrete steps in turn, in a manner that is helpful in understanding the present invention; however, the order of description should not be construed as to imply that these operations are necessarily order dependent.

Various embodiments are illustrated in terms of exemplary classes and/or objects in an object-oriented programming paradigm. It will be apparent to one skilled in the art that the present invention can be practiced using any number of different classes/objects, not merely those included here for illustrative purposes.

Aspects of the invention are illustrated by way of example and not by way of limitation in the figures of the accompanying drawings in which like references indicate similar elements. It should be noted that references to 'an' or 'one' embodiment in this disclosure are not necessarily to the same embodiment, and such references mean at least one.

Further Embodiments

Embodiments contemplated herein include Embodiments P1-P20, Q1-Q20, and R1-R23 following.

Embodiment P1. A NMR probe including a first circuit comprising a sample coil surrounding a sample, where the sample comprises at least two different nuclei species, where the NMR probe is adapted to excite at least two modes corresponding to the at least two different nuclei species, a second circuit comprising a loop gap coil and a first variable capacitor, where the second circuit is not electrically connected to the first circuit, where the loop gap coil is inductively coupled to the sample coil, where the first variable capacitor adjusts a level of splitting of the sample coil and the loop gap coil such that the level of splitting is not optimized for the at least two modes, and a third circuit comprising an element, where the third circuit is not inductively coupled to the loop gap coil, where the third circuit is electrically connected to the second circuit, where the element adjusts a first current flowing in the third circuit, where the first current adjusts a second current flowing in the second circuit, where the second current adjusts the level of splitting, where the element is adapted to adjust the level of splitting such that the level of splitting is optimized for the at least two modes, where the NMR probe detects one or more of the at least two modes.

Embodiment P2. The NMR probe of Embodiment P1, where the element comprises a second variable capacitor, where the second variable capacitor adjusts the level of splitting such that the level of splitting is optimized for the at least two modes.

Embodiment P3. The NMR probe of Embodiment P1, where the element comprises a variable inductor, where the variable inductor adjusts the level of splitting such that the level of splitting is optimized for the at least two modes.

Embodiment P4. The NMR probe of Embodiment P1, where the element comprises a variable resistor, where the variable resistor adjusts the level of splitting such that the level of splitting is optimized for the at least two modes.

Embodiment P5. The NMR probe of Embodiment P1, where the element comprises a second variable capacitor and one or both a variable inductor and a variable resistor, where one or both the second variable capacitor and/or the variable inductor and/or the variable resistor adjusts the level of splitting such that the level of splitting is optimized for the at least two modes.

Embodiment P6. The NMR probe of Embodiment P1, where the element comprises a variable inductor and a variable resistor, where one or both the variable inductor and/or the variable resistor adjusts the level of splitting such that the level of splitting is optimized for the at least two modes.

Embodiment P7. The NMR probe of Embodiment P1, where the at least two modes comprise a $^{1}H$ primary resonance mode and a $^{19}F$ primary resonance mode.

Embodiment P8. The NMR probe of Embodiment P1, where using the element to reduce the second current flowing in the loop gap coil to increase the splitting of a primary resonance mode improves detection of one or more of the at least two modes.

Embodiment P9. The NMR probe of Embodiment P1, where using the element to reduce the second current flowing in the loop gap coil to increase the splitting of a primary resonance mode improves the signal to noise of one or more of the at least two modes.

Embodiment P10. The NMR probe of Embodiment P1, where the first variable capacitor is set when the NMR probe is manufactured in a factory.

Embodiment P11. The NMR probe of Embodiment P10, where the element is used to tune the splitting between the sample coil and the loop gap coil.

Embodiment P12. A method of detecting a resonance of at least two nuclei from a sample with a NMR probe including (A) inductively coupling the NMR probe including a first circuit comprising a sample coil surrounding the sample, where the sample comprises at least two nuclei, where the at least two nuclei are different nuclei, where the NMR probe is adapted to excite at least two modes corresponding to the at least two nuclei, a second circuit comprising a loop gap coil and a first variable capacitor, where the second circuit is not electrically connected to the first circuit, where the loop gap coil is inductively coupled to the sample coil, a third circuit comprising an element, where the third circuit is not inductively coupled to the loop gap coil, where the third circuit is not inductively coupled to the sample coil, where the third circuit is electrically connected to the second circuit, (B) adjusting the first variable capacitor such that the splitting of the sample coil and the loop gap coil is not optimized for the at least two modes, and (C) adjusting the element such that the splitting of the sample coil and the loop gap coil is optimized for the at least two modes to detect one or more of the at least two modes.

Embodiment P13. The method of Embodiment P12, where the element comprises a second variable capacitor, where the second variable capacitor adjusts a level of splitting such that the level of splitting is optimized for the at least two modes.

Embodiment P14. The method of Embodiment P12, where the element comprises a variable inductor, where the variable inductor adjusts a level of splitting such that the level of splitting is optimized for the at least two modes.

Embodiment P15. The method of Embodiment P12, where the element comprises a variable resistor, where the variable resistor adjusts a level of splitting such that the level of splitting is optimized for the at least two modes.

Embodiment P16. The method of Embodiment P12, where the element comprises a second variable capacitor and one or both a variable inductor and a variable resistor, where one or both the second variable capacitor and/or the variable inductor and/or the variable resistor adjusts a level of splitting such that the level of splitting is optimized for the at least two modes.

Embodiment P17. The method of Embodiment P12, where the element comprises a variable inductor and a variable resistor, where one or both the variable inductor and/or the variable resistor adjusts a level of splitting such that the level of splitting is optimized for the at least two modes.

Embodiment P18. The method of Embodiment P12, where the at least two modes comprise a $^{1}$H primary resonance mode and a $^{19}$F primary resonance mode.

Embodiment P19. A NMR probe adapted to detect at least two different nuclei species from a sample including a first circuit comprising a sample coil surrounding the sample, where the NMR probe is adapted to excite at least two modes corresponding to the at least two different nuclei species, a second circuit comprising a loop gap coil and a first variable capacitor, where the loop gap coil is adapted to inductively couple to the sample coil, where the first variable capacitor adjusts a level of splitting of the sample coil and the loop gap coil such that the level of splitting is not optimized for the at least two modes, and a third circuit comprising an element, where the third circuit is not electrically connected to the second circuit, where the third circuit is adapted to inductively couple to the loop gap coil, where the element adjusts a first current flowing in the third circuit, where the first current adjusts a second current flowing in the second circuit, where the second current adjusts the level of splitting, where the element adjusts the level of splitting such that the level of splitting is optimized for the at least two modes, where the NMR probe detects one or more of the at least two modes.

Embodiment P20. The NMR probe of Embodiment P19, where the splitting is not optimized when a monitored resonance frequency of the at least two modes is less than approximately 99.97% of the one or both resonance frequencies of the at least two different nuclei species, where the splitting is optimized when the monitored resonance frequency of the at least two modes is greater than approximately 99.97% of both of the resonance frequencies of the at least two different nuclei species.

Embodiment Q1. A method of detecting a NMR (Nuclear Magnetic Resonance) of at least two nuclei species n1 and n2, from a sample including, (A) receiving the sample in a NMR probe including, a first circuit comprising a sample coil surrounding the sample, where the sample includes the at least two nuclei species n1 and n2, where f1 is a lower resonance frequency of n1, where f2 is an upper resonance frequency of n2, where f2 is >f1, a second circuit comprising a loop gap coil and a first variable capacitor, where the second circuit is not electrically connected to the first circuit, where the loop gap coil is adapted to inductively couple to the sample coil, a third circuit comprising an element, where the third circuit is not inductively coupled to the loop gap coil, where the third circuit is not inductively coupled to the sample coil, where the third circuit is electrically connected to the second circuit, (B) adjusting the sample coil frequency to approximately (f2+f1)/2 (where approximately in this range means plus or minus 5000 p.p.m., or 5%), (C) adjusting the first variable capacitor such that the lower resonance frequency of n1 is <approximately 97% of f1 and the upper resonance frequency of n2 is >approximately 97% of f2 (where approximately in this range means plus or minus 2000 p.p.m., or 2%), and (D) adjusting the element such that the lower resonance frequency of n1 is approximately 100% of f1 and the upper resonance frequency of n2 is approximately 100% of f2 (where approximately in this range means plus or minus 500 p.p.m., or 0.5%).

Embodiment Q2. The method of Embodiment Q1, where n2 is $^{1}$H and n1 is $^{19}$F.

Embodiment Q3. The method of Embodiment Q1, where the element includes one or more of a second variable capacitor, a variable inductor and a variable resistor, where the element adjusts the lower resonance frequency of n1 to approximately 100% of f1 and the upper resonance frequency of n2 to approximately 100% of f2 (where approximately in this range means plus or minus 500 p.p.m., or 0.5%).

Embodiment Q4. The method of Embodiment Q1, where the element includes a variable inductor and a variable resistor, where one or both the variable inductor and/or the variable resistor adjusts the lower resonance frequency of n1 to approximately 100% of f1 and the upper resonance frequency of n2 to approximately 100% of f2, (where approximately in this range means plus or minus 500 p.p.m., or 0.5%).

Embodiment Q5. The method of Embodiment Q1, where using the element increases the level of splitting and thereby improves signal to noise of one or more of f1 and f2.

Embodiment Q6. The method of Embodiment Q1, where the NMR probe is adapted to set the capacitance of the first variable capacitor in a factory.

Embodiment Q7. A NMR probe (Nuclear Magnetic Resonance probe) including, a first circuit comprising a sample coil surrounding a sample, where the sample includes at least two different nuclei species n1 and n2, where f1 is a lower resonance frequency of n1, where f2 is an upper resonance frequency of n2, where f2 is >f1, a second circuit comprising a loop gap coil and a first variable capacitor, where the second circuit is not electrically connected to the first circuit, where the loop gap coil is inductively coupled to the sample coil, and a third circuit comprising an element, where the third circuit is not inductively coupled to the loop gap coil, where the third circuit is electrically connected to the second circuit, where the element adjusts a first current flowing in the third circuit, where the first current adjusts a second current flowing in the second circuit, where the NMR probe detects one or more of f1 and f2.

Embodiment Q8. The NMR probe of Embodiment Q7, where n2 is $^{1}H$ and n1 is $^{19}F$.

Embodiment Q9. The NMR probe of Embodiment Q7, where prior to the loop gap coil being inductively coupled to the sample coil, the sample coil frequency is adapted to be adjusted to approximately (f2+f1)/2 (where approximately in this range means plus or minus 5000 p.p.m., or 5%).

Embodiment Q10. The NMR probe of Embodiment Q7, where after the loop gap coil is inductively coupled to the sample coil, the first variable capacitor adjusts the level of splitting in the lower resonance frequency of n1 to <approximately 97% of f1, and the upper resonance frequency of n2 to >approximately 97% of f2 (where approximately in this range means plus or minus 2000 p.p.m., or 2%).

Embodiment Q11. The NMR probe of Embodiment Q7, where the element adjusts a first measurement of the lower resonance frequency of n1 at approximately 100% of f1 and/or a second measurement of the upper resonance frequency of n2 at approximately 100% of f2 (where approximately in this range means plus or minus 500 p.p.m., or 0.5%).

Embodiment Q12. The NMR probe of Embodiment Q7, where the element includes one or more of a second variable capacitor, a variable inductor, and a variable resistor to adjust the level of splitting to measure the lower resonance frequency of n1 at approximately 100% of f1 and/or the upper resonance frequency of n2 at approximately 100% of f2 (where approximately in this range means plus or minus 500 p.p.m., or 0.5%).

Embodiment Q13. The NMR probe of Embodiment Q7, where the element includes a second variable capacitor and one or both a variable inductor and a variable resistor, where one or both the second variable capacitor and/or the variable inductor and/or the variable resistor adjusts the level of splitting to measure the lower resonance frequency of n1 at approximately 100% of f1 and measure the upper resonance frequency of n2 at approximately 100% of f2 (where approximately in this range means plus or minus 500 p.p.m., or 0.5%).

Embodiment Q14. The NMR probe of Embodiment Q7, where the element includes a variable inductor and a variable resistor, where one or both the variable inductor and/or the variable resistor adjusts the level of splitting to measure the lower resonance frequency of n1 at approximately 100% of f1 and measure the upper resonance frequency of n2 at approximately 100% of f2 (where approximately in this range means plus or minus 500 p.p.m., or 0.5%).

Embodiment Q15. The NMR probe of Embodiment Q7, where the element improves signal to noise of one or both the lower resonance frequency of n1 and the upper resonance frequency of n2.

Embodiment Q16. The NMR probe of Embodiment Q7, where the first variable capacitor is set when the NMR probe is manufactured in a factory.

Embodiment Q17. A NMR probe (Nuclear Magnetic Resonance probe) including, a first circuit comprising a sample coil surrounding a sample, where the sample includes at least two different nuclei species n1 and n2, where f1 is a lower resonance frequency of n1, where f2 is an upper resonance frequency of n2, where f2 is >f1, a second circuit comprising a loop gap coil and a first variable capacitor, where the second circuit is not electrically connected to the first circuit, where prior to the loop gap coil being inductively coupled to the sample coil, the sample coil frequency is adapted to be adjusted to approximately (f2+f1)/2 (where approximately in this range means plus or minus 5000 p.p.m., or 5%), where the loop gap coil is inductively coupled to the sample coil, the first variable capacitor adjusts the level of splitting in the lower resonance frequency of n1 to <approximately 97% of f1, and the upper resonance frequency of n2 to >approximately 97% of f2 (where approximately in this range means plus or minus 2000 p.p.m., or 2%), and a third circuit comprising an element, where the third circuit is not inductively coupled to the loop gap coil, where the third circuit is electrically connected to the second circuit, where the element adjusts the level of splitting of the lower resonance frequency of n1 to approximately 100% of f1, and the upper resonance frequency of n2 to approximately 100% of f2 (where approximately in this range means plus or minus 500 p.p.m., or 0.5%).

Embodiment Q18. The NMR probe of Embodiment Q17, where n2 is $^{1}H$ and n1 is $^{19}F$.

Embodiment Q19. The NMR probe of Embodiment Q17, where the element includes one or more of a second variable capacitor, a variable inductor, and a variable resistor to adjust the level of splitting to measure the lower resonance frequency of n1 at approximately 100% of f1 and/or the upper resonance frequency of n2 at approximately 100% of f2 (where approximately in this range means plus or minus 500 p.p.m., or 0.5%).

Embodiment Q20. The NMR probe of Embodiment Q17, where the element includes a second variable capacitor and one or both a variable inductor and a variable resistor, where one or both the second variable capacitor and/or the variable inductor and/or the variable resistor adjusts the level of splitting to measure the lower resonance frequency of n1 at approximately 100% of f1 and measure the upper resonance frequency of n2 at approximately 100% of f2 (where approximately in this range means plus or minus 500 p.p.m., or 0.5%).

Embodiment R1. A method of detecting a NMR of at least two nuclei species n1 and n2, from a sample including (A) receiving the sample in a NMR probe including a first circuit comprising a sample coil surrounding the sample, where the sample comprises the at least two nuclei species n1 and n2, where f1 is a lower resonance frequency of n1, where f2 is an upper resonance frequency of n2, where f2 is greater than f1, a second circuit comprising a loop gap coil and a first variable capacitor, where the second circuit is not electrically connected to the first circuit, where the loop gap coil is adapted to inductively couple to the sample coil, a third circuit comprising an element, where the third circuit is not inductively coupled to the loop gap coil, where the third circuit is not inductively coupled to the sample coil, where the third circuit is electrically connected to the second circuit, (B) adjusting a sample coil frequency to approximately (f2+f1)/2 (where approximately in this range means plus or minus 5000 p.p.m., or 5%), (C) adjusting the first variable capacitor such that the lower resonance frequency of n1 is at least 1% removed from f1, and the upper resonance frequency of n2 is at least 1% removed from f2, and (D) adjusting the element such that the lower resonance frequency of n1 is approximately 100% of f1 and the upper resonance frequency of n2 is approximately 100% of f2 (where approximately in this range means plus or minus 500 p.p.m., or 0.5%).

Embodiment R2. The method of claim 1, where n2 is $^1$H and n1 is $^{19}$F.

Embodiment R3. The method of claim 1, where the element comprises one or more of a second variable capacitor, a variable inductor and a variable resistor.

Embodiment R4. The method of claim 1, where the element comprises a second variable capacitor and one or both a variable inductor and a variable resistor.

Embodiment R5. The method of claim 1, where the element is adapted to modulate a level of splitting of f1 and f2 and thereby modulates signal to noise of one or both f1 and f2.

Embodiment R6. The method of claim 1, where the NMR probe is adapted to set a capacitance of the first variable capacitor in a factory.

Embodiment R7. A NMR probe including a first circuit comprising a sample coil surrounding a sample, where the sample comprises at least two different nuclei species n1 and n2, where f1 is a lower resonance frequency of n1, where f2 is an upper resonance frequency of n2, where f2 is greater than f1, a second circuit comprising a loop gap coil and a first variable capacitor, where the second circuit is not electrically connected to the first circuit, where the loop gap coil is inductively coupled to the sample coil, and a third circuit comprising an element, where the third circuit is not inductively coupled to the loop gap coil, where the third circuit is electrically connected to the second circuit, where the element adjusts a first current flowing in the third circuit, where the first current adjusts a second current flowing in the second circuit, where the NMR probe detects one or more of f1 and f2.

Embodiment R8. The NMR probe of claim 7, where n1 is $^{19}$F and n2 is $^1$H.

Embodiment R9. The NMR probe of claim 7, where prior to the loop gap coil being inductively coupled to the sample coil, a sample coil frequency is adapted to be adjusted to approximately (f2+f1)/2 (where approximately in this range means plus or minus 5000 p.p.m., or 5%).

Embodiment R10. The NMR probe of claim 7, where after the loop gap coil is inductively coupled to the sample coil, the first variable capacitor adjusts the lower resonance frequency of n1 to at least 1% removed from f1, and the upper resonance frequency of n2 to at least 1% removed from f2.

Embodiment R11. The NMR probe of claim 7, where the element adjusts the lower resonance frequency of n1 to approximately 100% of f1 and/or the upper resonance frequency of n2 to approximately 100% of f2 (where approximately in this range means plus or minus 500 p.p.m., or 0.5%).

Embodiment R12. The NMR probe of claim 7, where the element comprises one or more of a second variable capacitor, a variable inductor, and a variable resistor.

Embodiment R13. The NMR probe of claim 7, where the element comprises a second variable capacitor and one or both a variable inductor and a variable resistor.

Embodiment R14. The NMR probe of claim 7, where the element improves signal to noise of one or both the lower resonance frequency of n1 and the upper resonance frequency of n2.

Embodiment R15. The NMR probe of claim 7, where the first variable capacitor is set prior to final delivery of the NMR probe to an end user.

Embodiment R16. A NMR probe including a first circuit comprising a sample coil surrounding a sample, where the sample comprises at least two different nuclei species n1 and n2, where f1 is a lower resonance frequency of n1, where f2 is an upper resonance frequency of n2, where f2 is greater than f1, a second circuit comprising a loop gap coil and a first variable capacitor, where the second circuit is not electrically connected to the first circuit, where prior to the loop gap coil being inductively coupled to the sample coil, a sample coil frequency is adapted to be adjusted to approximately (f2+f1)/2 (where approximately in this range means plus or minus 5000 p.p.m., or 5%), where the loop gap coil is inductively coupled to the sample coil, where the first variable capacitor adjusts the lower resonance frequency of n1 to at least 1% removed from f1, and the upper resonance frequency of n2 to at least 1% removed from f2, and a third circuit comprising an element, where the third circuit is not inductively coupled to the loop gap coil, where the third circuit is electrically connected to the second circuit, where the element adjusts the lower resonance frequency of n1 to approximately 100% of f1, and the upper resonance frequency of n2 to approximately 100% of f2 (where approximately in this range means plus or minus 500 p.p.m., or 0.5%).

Embodiment R17. The NMR probe of claim 16, where n2 is $^1$H and n1 is $^{19}$F.

Embodiment R18. The NMR probe of claim 16, where the element comprises one or more of a second variable capacitor, a variable inductor, and a variable resistor.

Embodiment R19. The NMR probe of claim 16, where the element comprises one or more of a second variable capacitor, a variable inductor, and a variable resistor.

Embodiment R20. The NMR probe of claim 16, where the first variable capacitor is set prior to final delivery of the NMR probe to an end user.

Embodiment R21. A method of detecting a NMR of at least two nuclei species n1 and n2, from a sample including (A) receiving the sample in a NMR probe including a first circuit comprising a sample coil surrounding the sample, where the sample comprises the at least two nuclei species n1 and n2, where f1 is a lower resonance frequency of n1, where f2 is an upper resonance frequency of n2, where f2 is greater than f1, a second circuit comprising a loop gap coil and a first variable capacitor, where the second circuit is not electrically connected to the first circuit, where the loop gap coil is adapted to inductively couple to the sample coil, a third circuit comprising an element, where the third circuit is not inductively coupled to the loop gap coil, where the third circuit is not inductively coupled to the sample coil, where the third circuit is electrically connected to the second circuit, (B) adjusting a sample coil frequency to approximately (f2+f1)/2, (C) adjusting the first variable capacitor such that the lower resonance frequency of n1 is less than approximately 99% of f1 and the upper resonance frequency of n2 is greater than approximately 101% of f2, and (D) adjusting the element such that the lower resonance frequency of n1 is approximately 100% of f1 and the upper resonance frequency of n2 is approximately 100% of f2.

Embodiment R22. A NMR probe including a first circuit comprising a sample coil surrounding a sample, where the sample comprises at least two different nuclei species n1 and n2, where f1 is a lower resonance frequency of n1, where f2 is an upper resonance frequency of n2, where f2 is greater than f1, a second circuit comprising a loop gap coil and a first variable capacitor, where the second circuit is not electrically connected to the first circuit, where the loop gap coil is inductively coupled to the sample coil, where the first variable capacitor adjusts the lower resonance frequency of n1 to at least 1% removed from f1, and the upper resonance frequency of n2 to at least 1% removed from f2, and a third circuit comprising an element, where the third circuit is not inductively coupled to the loop gap coil, where the third circuit is electrically connected to the second circuit, where the element adjusts a first current flowing in the third circuit, where the first current adjusts a second current flowing in the second circuit, where the NMR probe detects one or more of f1 and f2.

Embodiment R23. A NMR probe including a first circuit comprising a sample coil surrounding a sample, where the sample comprises at least two different nuclei species n1 and n2, where f1 is a lower resonance frequency of n1, where f2 is an upper resonance frequency of n2, where f2 is greater than f1, a second circuit comprising a loop gap coil and a first variable capacitor, where the second circuit is not electrically connected to the first circuit, where the loop gap coil is inductively coupled to the sample coil, and a third circuit comprising an element, where the third circuit is not inductively coupled to the loop gap coil, where the third circuit is electrically connected to the second circuit, where the element adjusts a first current flowing in the third circuit, where the first current adjusts a second current flowing in the second circuit, where the element adjusts a first measurement of the lower resonance frequency of n1 to approximately 100% of f1 and/or a second measurement of the upper resonance frequency of n2 to approximately 100% of f2, where the NMR probe detects one or more of f1 and f2.

Abbreviations: Circuit Fill Factor=CFF; Circuit Fill Factor for a specific mode, k, referred to a reference inductor, a=$CFF_{k,a}$; Magnetic Field=$B_1$; Nuclear Magnetic Resonance=NMR; Quality Factor=Q; Quality factor for a resonator k=$Q_k$; Radio Frequency=RF; Sample Fill Factor=SFF; Signal to Noise Ratio=SNR; Static Magnetic Field=$B_0$; Unloaded Q=$Q_u$.

While the systems, methods, and devices have been illustrated by the described examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and devices provided herein. Additional advantages and modifications will readily be apparent to those skilled in the art. Therefore, the invention, in its broader aspects, is not limited to the specific details, the representative system, method or device, and illustrative examples shown and described. Accordingly, departures may be made from such details without departing from the spirit or scope of the applicant's general inventive concept. Thus, this application is intended to embrace alterations, modifications, and variations that fall within the scope of the appended claims. Furthermore, the preceding description is not meant to limit the scope of the invention. Rather, the scope of the invention is to be determined by the appended claims and their equivalents.

The invention claimed is:

1. A method of detecting a NMR (Nuclear Magnetic Resonance) of at least two nuclei species n1 and n2, from a sample comprising:

(A) receiving the sample in a NMR probe comprising:

a first circuit comprising a sample coil surrounding the sample, where the sample comprises the at least two nuclei species n1 and n2, where f1 is a lower resonance frequency of n1, where f2 is an upper resonance frequency of n2, where f2 is greater than f1;

a second circuit comprising a loop gap coil and a first variable capacitor, where the second circuit is not electrically connected to the first circuit, where the loop gap coil is adapted to inductively couple to the sample coil;

a third circuit comprising an element, where the third circuit is not inductively coupled to the loop gap coil, where the third circuit is not inductively coupled to the sample coil, where the third circuit is electrically connected to the second circuit;

(B) adjusting a sample coil frequency to approximately (f2+f1)/2;

(C) adjusting the first variable capacitor such that the lower resonance frequency of n1 is at least 1% removed from f1, and the upper resonance frequency of n2 is at least 1% removed from f2; and (D) adjusting the element such that the lower resonance frequency of n1 is approximately 100% of f1 and the upper resonance frequency of n2 is approximately 100% of f2.

2. The method of claim 1, where n1 is 19F and n2 is 1H.

3. The method of claim 1, where the element comprises one or more of a second variable capacitor, a variable inductor and a variable resistor.

4. The method of claim 1, where the element comprises a second variable capacitor and one or both a variable inductor and a variable resistor.

5. The method of claim 1, where the element is adapted to modulate a level of splitting of f1 and f2 and thereby modulate signal to noise of one or both f1 and f2.

6. The method of claim 1, where the first variable capacitor is set prior to final delivery of the NMR probe to an end user.

7. A NMR probe (Nuclear Magnetic Resonance probe) comprising:

a first circuit comprising a sample coil surrounding a sample, where the sample comprises at least two different nuclei species n1 and n2, where f1 is a lower resonance frequency of n1, where f2 is an upper resonance frequency of n2, where f2 is greater than f1;

a second circuit comprising a loop gap coil and a first variable capacitor, where the second circuit is not electrically connected to the first circuit, where the loop gap coil is inductively coupled to the sample coil; and a third circuit comprising an element, where the third circuit is not inductively coupled to the loop gap coil, where the third circuit is electrically connected to the second circuit, where the element adjusts a first current flowing in the third circuit, where the first current adjusts a second current flowing in the second circuit, where the NMR probe detects one or more of f1 and f2.

8. The NMR probe of claim 7, where n1 is $^{19}F$ and n2 is $^{1}H$.

9. The NMR probe of claim 7, where prior to the loop gap coil being inductively coupled to the sample coil, a sample coil frequency is adapted to be adjusted to approximately (f2+f1)/2.

10. The NMR probe of claim 7, where after the loop gap coil is inductively coupled to the sample coil, the first variable capacitor adjusts the lower resonance frequency of n1 to at least 1% removed from f1, and the upper resonance frequency of n2 to at least 1% removed from f2.

11. The NMR probe of claim 7, where the element adjusts the lower resonance frequency of n1 to approximately 100% of f1 and/or the upper resonance frequency of n2 to approximately 100% of f2.

12. The NMR probe of claim 7, where the element comprises one or more of a second variable capacitor, a variable inductor, and a variable resistor.

13. The NMR probe of claim 7, where the element comprises a second variable capacitor and one or both a variable inductor and a variable resistor.

14. The NMR probe of claim 7, where the element improves signal to noise of one or both the lower resonance frequency of n1 and the upper resonance frequency of n2.

15. The NMR probe of claim 7, where the first variable capacitor is set prior to final delivery of the NMR probe to an end user.

16. A NMR probe (Nuclear Magnetic Resonance probe) comprising:

a first circuit comprising a sample coil surrounding a sample, where the sample comprises at least two different nuclei species n1 and n2, where f1 is a lower resonance frequency of n1, where f2 is an upper resonance frequency of n2, where f2 is greater than f1;

a second circuit comprising a loop gap coil and a first variable capacitor, where the second circuit is not electrically connected to the first circuit, where prior to the loop gap coil being inductively coupled to the sample coil, a sample coil frequency is adapted to be adjusted to approximately (f2+f1)/2, where the loop gap coil is inductively coupled to the sample coil, where the first variable capacitor adjusts the lower resonance frequency of n1 to at least 1% removed from f1, and the upper resonance frequency of n2 to at least 1% removed from f2; and a third circuit comprising an element, where the third circuit is not inductively coupled to the loop gap coil, where the third circuit is electrically connected to the second circuit, where the element adjusts the lower resonance frequency of n1 to approximately 100% of f1, and the upper resonance frequency of n2 to approximately 100% of f2.

17. The NMR probe of claim 16, where n1 is $^{19}F$ and n2 is $^{1}H$.

18. The NMR probe of claim 16, where the element comprises one or more of a second variable capacitor, a variable inductor, and a variable resistor.

19. The NMR probe of claim 16, where the element is selected from the group consisting of one or more of a second variable capacitor, a variable inductor and a variable resistor.

20. The NMR probe of claim 16, where the first variable capacitor is set prior to final delivery of the NMR probe to an end user.

* * * * *